United States Patent
Tsuruya et al.

(10) Patent No.: US 10,049,042 B2
(45) Date of Patent: Aug. 14, 2018

(54) STORAGE DEVICE, SEMICONDUCTOR MEMORY DEVICE, AND METHOD FOR CONTROLLING SAME

(71) Applicant: HITACHI, LTD., Tokyo (JP)

(72) Inventors: Masahiro Tsuruya, Tokyo (JP); Atsushi Kawamura, Tokyo (JP); Akifumi Suzuki, Tokyo (JP); Hideyuki Koseki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/505,660

(22) PCT Filed: Sep. 22, 2014

(86) PCT No.: PCT/JP2014/075059
§ 371 (c)(1),
(2) Date: Feb. 22, 2017

(87) PCT Pub. No.: WO2016/046880
PCT Pub. Date: Mar. 31, 2016

(65) Prior Publication Data
US 2017/0277631 A1    Sep. 28, 2017

(51) Int. Cl.
| | |
|---|---|
| *G11C 8/16* | (2006.01) |
| *G11C 7/22* | (2006.01) |
| *G06F 12/06* | (2006.01) |
| *G11C 11/404* | (2006.01) |
| *G11C 11/56* | (2006.01) |
| *G11C 15/04* | (2006.01) |
| *G11C 29/00* | (2006.01) |

(Continued)

(52) U.S. Cl.
CPC .......... *G06F 12/063* (2013.01); *G11C 11/404* (2013.01); *G11C 11/4074* (2013.01); *G11C 11/5642* (2013.01); *G11C 15/04* (2013.01); *G11C 16/06* (2013.01); *G11C 29/76* (2013.01)

(58) Field of Classification Search
CPC ... G06F 12/1027; G06F 3/061; G06F 12/0246
USPC .......................................... 711/202, 206, 163
See application file for complete search history.

(56) References Cited

U.S. PATENT DOCUMENTS

| | | | | |
|---|---|---|---|---|
| 6,662,289 | B1 * | 12/2003 | Ang | G06F 12/1027 711/202 |
| 9,645,746 | B2 * | 5/2017 | Berke | G06F 3/061 |

(Continued)

FOREIGN PATENT DOCUMENTS

| | | |
|---|---|---|
| JP | 2006-221627 A | 8/2006 |
| JP | 2010-521718 A | 6/2010 |

(Continued)

*Primary Examiner* — Hoai V Ho
*Assistant Examiner* — Minh Dinh
(74) *Attorney, Agent, or Firm* — Volpe and Koenig, P.C.

(57) ABSTRACT

The present invention improves an access performance in an SSD device in which a nonvolatile semiconductor, such as a NAND flash memory, is mounted, or in a storage subsystem having the SSD device built therein, and achieves longer operating life. For this purpose, a plurality of units (logical-physical sizes) for associating a logical address with a physical address is provided in the SSD device or the storage subsystem, and an appropriate logical-physical size is selected in accordance with an I/O size or I/O pattern accessed from a superior device.

10 Claims, 24 Drawing Sheets

(51) Int. Cl.
*G11C 11/4074* (2006.01)
*G11C 16/06* (2006.01)

(56) References Cited

U.S. PATENT DOCUMENTS

| | | | |
|---|---|---|---|
| 2006/0080505 A1* | 4/2006 | Arai | G06F 11/1076 |
| | | | 711/114 |
| 2006/0179212 A1 | 8/2006 | Kim et al. | |
| 2010/0037009 A1 | 2/2010 | Yano et al. | |
| 2010/0100667 A1 | 4/2010 | Kang et al. | |
| 2016/0170871 A1* | 6/2016 | Hyun | G06F 12/0246 |
| | | | 711/103 |

FOREIGN PATENT DOCUMENTS

| | | |
|---|---|---|
| JP | 2012-164114 A | 8/2012 |
| JP | 2014-071611 A | 4/2014 |

* cited by examiner

FIG. 5

| Virtual Page # | Allocation Status (Allocated / Not Allocated) | Logical-Physical Size | Initial Logical Page # | Number of Allocated Pages | Write Throughput | Average Write Size | Write Rate smaller than Logical-Physical Size |
|---|---|---|---|---|---|---|---|
| 0 | Allocated | 8kB | x | 128 | 1 MB/s | 8kB | 1% |
| 1 | Not Allocated | - | - | - | - | - | - |
| 2 | Allocated | 16kB | y | 64 | 5 MB/s | 64kB | 2% |
| ... | ... | ... | ... | ... | ... | ... | ... |

0311 / V2L-TBL

FIG. 7

| Device Capacity | Corresponding Logical-Physical Size | Logical-Physical Size Allocation Rate |
|---|---|---|
| 1000 GB | 8 kB | 50 % |
| | 16 kB | 30 % |
| | ... | ... |

SSD Information TBL

| 1502 | 1503 | 1504 | 1505 | 1506 | 1507 | 1508 |

| Drive # | Drive Type | Capacity | 8kB Logical-Physical Space Start Address | 8kB Logical-Physical Space End Address | 16kB Logical-Physical Space Start Address | 16kB Logical-Physical Space End Address |
|---|---|---|---|---|---|---|
| 0 | SSD | 1000 GB | 0x00...00 | 0x3f...ff | 0x40...00 | 0x...ff |
| 1 | SSD | 1000 GB | 0x00...00 | 0x3f...ff | 0x40...00 | 0x...ff |
| 2 | SSD | 1000 GB | 0x00...00 | 0x3f...ff | 0x40...00 | 0x...ff |
| 3 | SSD | 1000 GB | 0x00...00 | 0x3f...ff | 0x40...00 | 0x...ff |
| 4 | SSD | 1000 GB | 0x00...00 | 0x7f...ff | 0x80...00 | 0x...ff |
| ... | ... | ... | ... | ... | ... | ... |
| n | HDD | 4000 GB | - | - | - | - |

Drive Management TBL

| 1602 | 1603 | 1604 | 1605 | 1606 |

| RG# | Drive Type | RAID Level | RAID Configuration | Drive # | | | |
|---|---|---|---|---|---|---|---|
| 0 | SSD | RAID1 | 2D+2P | 1 | 7 | ... | - |
| 1 | SSD | RAID5 | 6D+2P | 4 | 9 | ... | 21 |
| 2 | SSD | RAID5 | 3D+1P | 16 | 26 | ... | - |
| ... | ... | ... | ... | ... | ... | ... | ... |
| n | HDD | RAID5 | 7D+1P | 51 | 57 | ... | 63 |

RG Management TBL

FIG.17

| Pool# | RG# | RG Remaining Capacity | Pool Remaining Capacity |
|---|---|---|---|
| 0 | 0 | 123 GB | 1234 GB |
|   | 1 | 234 GB |  |
|   | ... | ... |  |
|   | 7 | 543 GB |  |
| ... | ... | ... | ... |

1411

1702 1703 1704 1705

Pool Management TBL

FIG.18

| Extent # | RG# | Size | Allocation Status (Allocated / Not Allocated) | Drive Type | Logical-Physical Size | Write Throughput | Average Write Size | Write Rate smaller than Logical-Physical Size | Drive # | Stripe # | Start LBA | End LBA |
|---|---|---|---|---|---|---|---|---|---|---|---|---|
| 0 | 0 | 1GB | Allocated | SSD | 8 kB | 1 MB/s | 8kB | 1% | 0 | 13 | 1000 | 2000 |
| | | | | | | | | | 1 | 17 | 18000 | 19000 |
| | | | | | | | | | 2 | 14 | 4000 | 5000 |
| ... | ... | ... | ... | ... | ... | ... | ... | ... | ... | ... | ... | ... |

Extent Management TBL

FIG.19

| LU# | Virtual Capacity | Real Capacity Utilization | Virtual Extent # | Assigned Extent # |
|---|---|---|---|---|
| 0 | 1024 GB | 256 GB | 0 | 0 |
| | | | 1 | 32 |
| | | | ... | ... |
| | | | n | - |
| ... | ... | ... | ... | ... |

LU Management TBL

STORAGE DEVICE, SEMICONDUCTOR MEMORY DEVICE, AND METHOD FOR CONTROLLING SAME

TECHNICAL FIELD

The present invention relates to a storage subsystem having a nonvolatile semiconductor storage medium, and an art for selecting an appropriate logical-physical unit in a semiconductor memory device.

BACKGROUND ART

Conventionally, HDDs (Hard Disk Drives) are generally used as physical storage media in storage subsystems and computers, but recently, physical storage media such as SSDs (Solid State Drives) having flash memories (hereinafter referred to as FMs) installed thereto are attracting attention as new physical storage media that may replace HDDs. The SSD is mainly configured of one or more FM chips and a controller controlling the FM, and it has an advantage in that I/O processing speed is extremely high compared to HDDs. However, in order to realize such high performance, a control technique corresponding to the characteristics of the FM is required.

The FM (typically a NAND-type FM) erases data in units called blocks (block erase), and reads/writes data in units called pages. The block is a set of multiple pages. The time required to ease a block is longer than reading/writing by an order of one digit or greater. Hereinafter, unless stated otherwise, the terms block and/or page refer to those of the FM.

Due to the characteristics of the FM, data cannot be overwritten to a page in which data is already written. Therefore, in order to rewrite the data of a page, block erase must be performed before writing data thereto. In order to execute block erase, valid data within the relevant block must be copied to a different block before executing block erase, such that longer data rewrite time is required compared to writing data to an unused area where block erase is already performed, and therefore, it is necessary to either reduce the data rewrite time or not show the elongation of response time to a superior device.

In order to realize reduction of data rewrite time described above, the data rewrite in the FM adopts a system of additionally writing data to an unused area. Therefore, the SSD includes a logical address space to be provided to a superior device and a physical address space corresponding to the respective FM pages. The logical address space and the physical address space are mapped using corresponding information of the respective addresses (logical-physical management information). Further, the process of referring to the logical-physical management information and acquiring the corresponding physical address based on the logical address is called logical-physical address transformation (logical-physical transformation). The present process is realized by a controller installed in the SSD.

We will now simply describe the operation of read and write of the FM in the SSD. In a read processing, the SSD refers to the logical-physical transformation information to specify the physical address in which the requested data is stored, and executes the logical-physical transformation. Thereafter, the SSD acquires the requested data from the FM based on the physical address acquired by the logical-physical transformation.

During write processing, the SSD writes the write data into an unused area having been subjected to block erase of the FM. Thereafter, the SSD refers to the logical-physical transformation information, and updates the physical address mapped to the relevant logical address to correspond to the newly written data (logical-physical update). The property of the FM is deteriorated through repeated block erase, so that in a state where erase is repeatedly performed to a specific block and a portion of the blocks become unusable, continuous use of the system may become impossible. Therefore, write destination of write data must be selected to use all blocks uniformly and level out the number of times of block erase.

As described above, read/write processing of the FM in the SSD requires accessing the logical-physical management information. Therefore, in the SSD, all the logical-physical management information stored in the FM is cached to a main memory, such as a high-speed DRAM (Dynamic Random Access Memory), such that access overhead to the logical-physical management information is reduced.

CITATION LIST

Patent Literature

[PTL 1] United States Patent Application No. 2010/0100667

SUMMARY OF INVENTION

Technical Problem

Along with the increase of FM capacity installed in the SSD, the size of the logical-physical management information has increased. Therefore, some SSDs adopt a system where not all the logical-physical management information are cached to the main memory, and information that cannot be stored in the main memory are acquired as needed from the FM (hierarchical logical-physical system). As described above, normally in the SSD, all the logical-physical management information are cached in the main memory, such that the access overhead to the logical-physical management information accompanying the read/write processing is small. On the other hand, according to the logical-physical hierarchical system, in a state where the relevant logical-physical management information is not in the main memory during logical-physical transformation or logical-physical update (logical-physical miss), there is a need to acquire the logical-physical management information from the FM. The access to the FM has an extremely large overhead compared to the access to the main memory, such that the system performance is deteriorated.

One method for reducing the amount of logical-physical management information by caching as much logical-physical management information as possible in the main memory and reducing the probability of occurrence of logical-physical miss is an expansion of logical page size (logical-physical size) serving as a mapping unit of logical and physical addresses (logical-physical unit). The reason for this is that the number of entries of logical-physical management information can be cut down by increasing the logical-physical size. Further, by performing I/O of large sizes, the number of times the logical-physical management information is referred to or updated can be reduced, and the system performance can be enhanced.

However, increasing the logical-physical size is equivalent to increasing the minimum write unit of the FM, and the amount of write to the FM is increased with respect to the writes smaller than the logical-physical size. For example, in a state where the superior device writes 8-kB data to the SSD having a 16-kB logical-physical size, the SSD performs write to the FM by a method called read-modify-write. The read-modify-write in the SSD relates to reading the data of a logical page including the write data (which is 16 kB in the present example) from the FM, overwriting the read data with the write data received from the superior device, and writing the relevant data to the FM. Therefore, the amount of write to the FM becomes greater than the amount of data write received from the superior device (8 kB becomes 16 kB according to the present example), such that the performance and life of the SSD is deteriorated. As described, the above-described performance deterioration of the SSD cannot be suppressed by simply increasing the logical-physical size.

Solution to Problem

In order to solve the problems described above, according to one aspect of the present invention, the SSD has a logical-physical distribution control unit configured to select an appropriate logical-physical size and a logical-physical transformation control unit corresponding to a plurality of logical-physical sizes, and selects an appropriate logical-physical size to store the write data in response to a write request from a superior device.

Advantageous Effects of Invention

According to the storage subsystem and the semiconductor memory device of the present invention, the frequency of logical-physical miss of I/O in the SSD can be either reduced or eliminated, and deterioration of system performance can be suppressed. Further, the number of times of reference and update of the logical-physical management information can be reduced, and system performance can be improved. Problems, configurations and effects other than those described earlier will be made clear by the following description of embodiments.

BRIEF DESCRIPTION OF DRAWINGS

FIG. 5 is a view illustrating a configuration example of a V2L-TBL 0311.

FIG. 7 is a view illustrating a configuration example of an SSD information TBL 0313.

FIG. 15 is a view illustrating a configuration example of a drive management TBL 1409.

FIG. 16 is a view illustrating a configuration example of an RG management TBL 1410.

FIG. 17 is a view illustrating a configuration example of a pool management TBL 1411.

FIG. 18 is a view illustrating a configuration example of an extent management TBL 1412.

FIG. 19 is a view illustrating a configuration example of an LU management TBL 1413.

DESCRIPTION OF EMBODIMENTS

Figure 1:
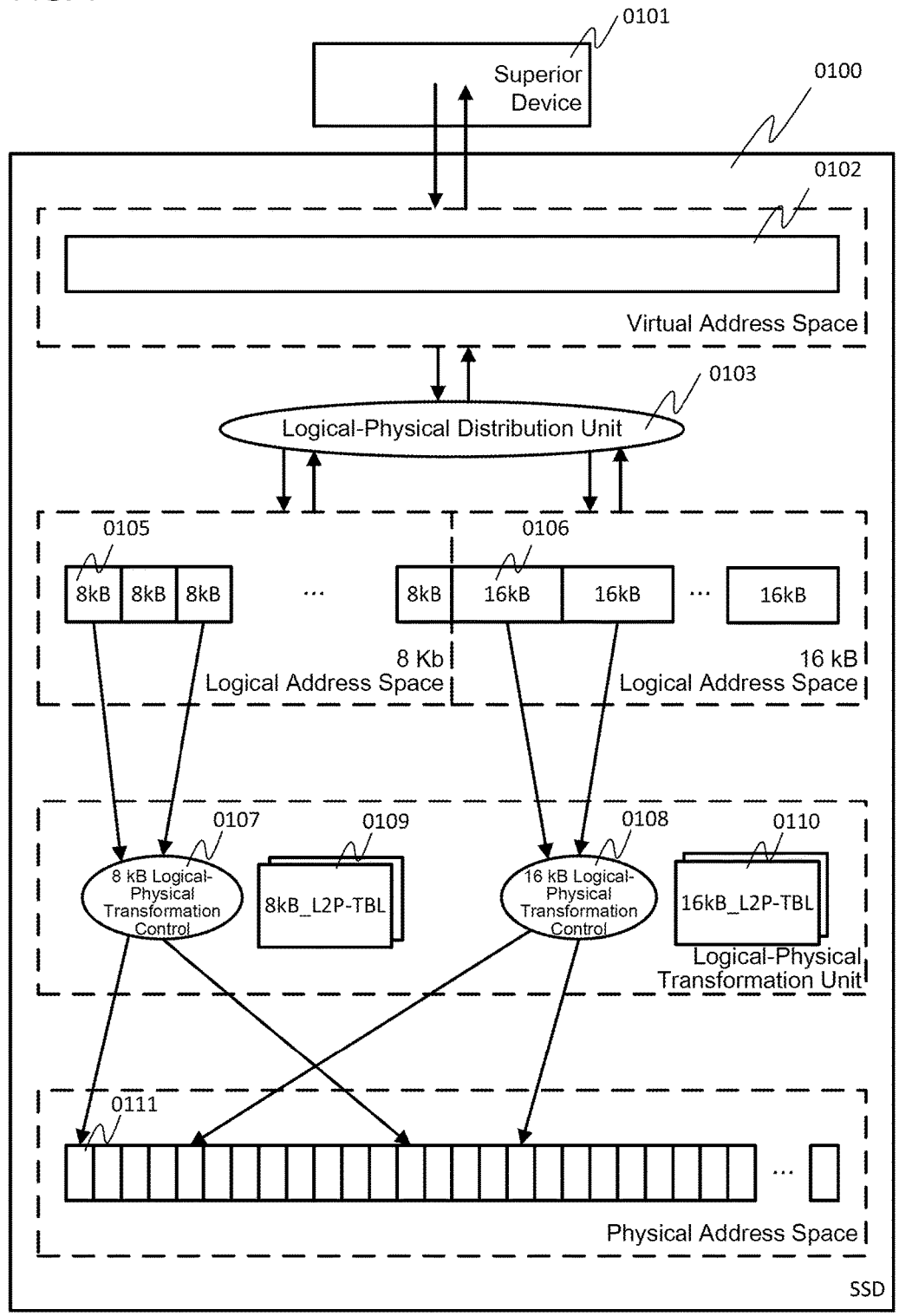
FIG. 1 is a view illustrating an outline of a first embodiment.

Embodiments of the present invention will now be described with reference to the drawings. In the following description, various information are referred to as "management tables", for example, but the various information can also be expressed by data structures other than tables. Further, the "management table" can also be referred to as "management information" to indicate that the information does not depend on the data structure. In the following description, numbers are used as identification information of elements (such as extents), but other types of identification information (such as names and identifiers) can also be used.

The processes are sometimes described using the term "program" as the subject. The program is executed by a processor such as an MP (Micro Processor) or a CPU (Central Processing Unit) for performing determined processes. A processor can also be the subject of the processes, since the processes are performed by a processor using appropriate storage resources (such as memories) and communication interface devices (such as communication ports). The processor can also use dedicated hardware in addition to the CPU. The computer programs can be installed to each computer from a program source. The program source can be provided via a program assignment server or storage media, for example.

Each element, such as each controller, can be identified by numbers, but other types of identification information such as names can be used as long as they are identifiable information. The equivalent elements are denoted with the same reference numbers in the drawings and the description of the present invention, but the present invention is not restricted to the present embodiments, and other modified examples in conformity with the idea of the present invention are included in the technical scope of the present invention. The number of each component can be one or more than one, unless defined otherwise.

In the following description, the units of period or time are not limited. For example, the unit of period or time can be expressed by one unit or a combination of two or more units selected from the following: year, month, day, hour, minute and second. In the following description, a nonvolatile semiconductor storage medium included in an SSD is a flash memory (FM). The flash memory is a type of flash memory in which erase is performed in block units and read/write is performed in page units, a typical example of which is a NAND flash memory. However, instead of a NAND flash memory, other types (such as an NOR type) of flash memories can be used. Further, instead of the flash memory, other types of nonvolatile semiconductor storage media, such as a phase change memory, can be adopted.

<Description of Technical Problem>

Figure 26:
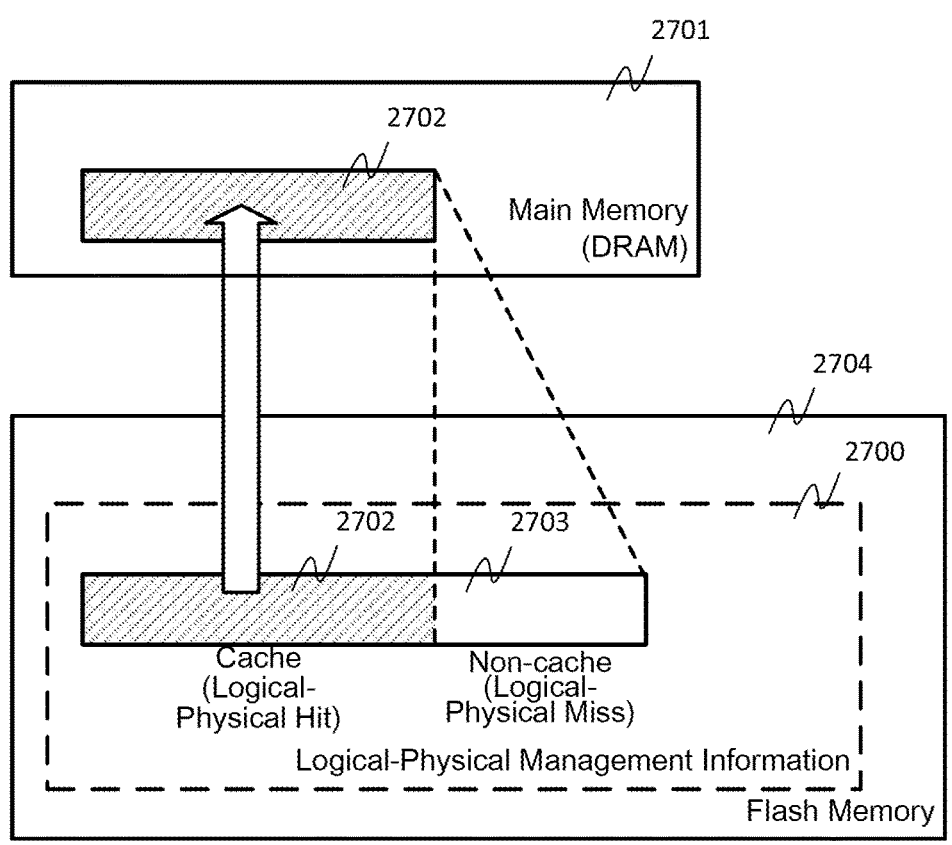
FIG. 26 is a view illustrating one example of a hierarchical logical-physical system.

Before describing the embodiments of the present invention, we will describe the technical problem to be solved by the present invention with reference to FIG. 26. FIG. 26 is a view illustrating one example of a hierarchical logical-physical system, and shows a method for storing logical-physical management information in an SSD adopting a hierarchical logical-physical system.

According to FIG. 26, in a logical-physical management information 2700, a logical-physical management information 2702 is cached in a main memory 2701, and a logical-physical management information 2703 is stored only in an FM 2704 (and not cached in the main memory 2701). The FM 2704, a typical example of which is the NAND FM, is of low speed compared to the main memory 2701 composed of a DRAM and the like, so that access to the logical-physical management information 2703 not cached in the main memory 2701 (logical-physical miss) is performed at a lower speed than the access to the logical-physical management information 2702 cached in the main memory 2701 (logical-physical hit). Thus, the performance of the SSD is deteriorated.

One considerable method for solving the problems of performance deterioration described above relates to reducing the capacity of the logical-physical management information 2700. One considerable method for reducing the capacity of the logical-physical management information 2700 relates to increasing the logical-physical size. The reason for this is that the number of entries of the logical-physical management information can be reduced by increasing the logical-physical size. For example, in a case of an SSD in which the FM page size is 16 kB and the logical-physical size is 8 kB, management information having a size of 8 kB×2 is required to store a 16-kB data to the FM. On the other hand, in a case of an SSD in which the FM page size is 16 kB and the logical-physical size is 16 kB, only management information having a size of 16 kB×1 is required to store a 16-kB data to the FM. In other words, the capacity of the logical-physical management information 2700 can be cut down by increasing the logical-physical size.

However, increasing the logical-physical size is equivalent to increasing the minimum write unit to the FM, so that the performance and life of the SSD are deteriorated in a case where the amount of write to the FM is increased with respect to the write of data size is smaller than the logical-physical size. Therefore, the performance deterioration of SSD described earlier cannot be suppressed simply by increasing the logical-physical size. In the following description, it is assumed that the logical-physical management information or the logical-physical management table (in the latter description, L2P-TBL (table)) of the SSD is managed using a logical-physical hierarchical system.

[First Embodiment]

A first embodiment relates to a single SSD device. The outline of a first preferred embodiment will be described with reference to FIG. 1. FIG. 1 is a view illustrating an outline of the first embodiment.

An SSD 0100 is connected to a superior device 0101. The superior device 0101 is one example of a device that utilizes the SSD 0100, and it can be an application server or a storage subsystem. The SSD 0100 has a virtual address space 0102, a logical-physical distribution unit 0103, an 8-kB logical address space 0105, a 16-kB logical address space 0106, an 8-kB logical-physical transformation control 0107, a 16-kB logical-physical transformation control 0108, an 8 kB_L2P-TBL 0109, a 16 kB_L2P-TBL 0110, and a physical address space 0111.

The virtual address space 0102 is an address space that is accessible from the superior device 0101, and corresponds to an LBA (Logical Block Address). Further, the virtual address space 0102 is mapped via the logical-physical distribution unit 0103 to the 8-kB logical address space 0105 or the 16-kB logical address space 0106 (here, the two spaces being integrated is called a logical address space).

The logical-physical distribution unit 0103 controls the mapping of the virtual address space 0102 and the logical address space. The logical-physical distribution unit 0103 monitors the I/O requests from the superior device 0101, and maps the relevant area of the virtual address space 0102 to the logical address space of the logical-physical size determined as appropriate. Therefore, the detailed control of the logical-physical distribution will be described with reference to a different drawing.

The 8-kB logical address space 0105 and the 16-kB logical address space 0106 are respectively mapped via the 8-kB logical-physical transformation control 0107 and the 16-kB logical-physical transformation control 0108 to the physical address space 0111. In the present embodiment, an example is illustrated where there are two logical-physical sizes, 8 kB and 16 kB, but there can be three or more sizes, such as 32 kB in addition to 8 kB and 16 kB. The combination of logical-physical sizes can be, for example, 4 kB and 8 kB or 16 kB and 64 kB.

The 8-kB logical-physical transformation control 0107 and the 16-kB logical-physical transformation control 0108 control the mapping of logical address space and physical address space. Specifically, a logical-physical transformation is performed where a logical address is transformed into a physical address, and a logical-physical update is performed where a logical address is mapped to a new physical address. Further, when the above control is executed, the 8-kB logical-physical transformation control 0107 and the 16-kB logical-physical transformation control 0108 refer to and update the logical-physical management information respectively stored in the 8 kB_L2P-TBL 0109 and the 16 kB_L2P-TBL 0110.

The 8 kB_L2P-TBL 0109 and the 16 kB_L2P-TBL 0110 include the mapping information of logical address space and physical address space. In the present embodiment, an example is illustrated where there are two types of logical-physical sizes, which are 8 kB and 16 kB, but there can be three or more tables, including two types of 32-kB logical-physical sizes. The physical address space 0111 is an address space associated to the respective pages of the FM installed in the SSD 0100.

As described above, according to the preferred embodiment of the present invention, multiple different logical-physical sizes are used appropriately within a single SSD. Specifically, the large logical-physical size is used to cut down the capacity of the logical-physical management information, and as for the area of the virtual address space (LBA) having a high write frequency of small size data, the small logical-physical size is used to suppress the frequency of write of a size smaller than the logical-physical size. Thereby, the performance of access from a superior device can be improved in an SSD adopting the logical-physical hierarchical system.

Figure 2:
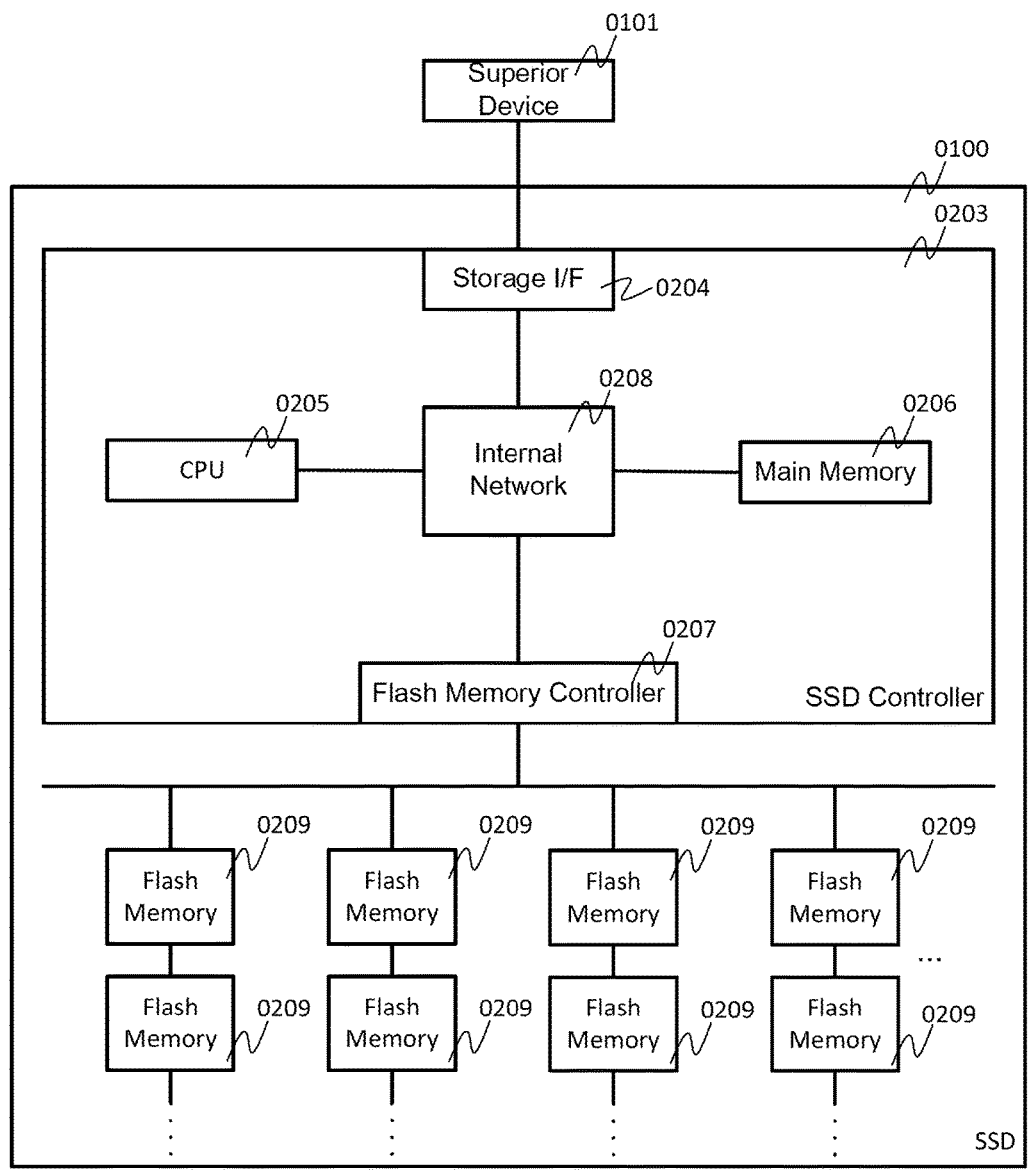
FIG. 2 is a view illustrating a configuration example of an SSD.

FIG. 2 is a view illustrating a configuration example of the SSD 0100. The SSD 0100 includes an SSD controller 0203 and one or more FM chips (Flash Memory Chips) 0209. The SSD controller 0203 controls the operation of the SSD 0100. The SSD controller 0203 is composed of a storage I/F 0204 in charge of connecting with the superior device 0101, a CPU 0205, a main memory 0206, and an FM controller 0207 controlling the FM, which are respectively mutually connected by an internal network 0208.

A CPU 206 is a processor for controlling the whole SSD controller 0203, operating by a microprogram stored in the main memory 0206. The FM controller 0207 is controlled by the CPU 206, and executes read, write and erase of the FM. The internal network 0208 can include a switch. It can also be substituted by an ASICs (Application Specific Integrated Circuit) having a switching function.

In the present embodiment, the SSD is a storage media having one or more FMs and a controller for controlling the same, and the outer shape and the like is not restricted to a form factor.

Figure 3:
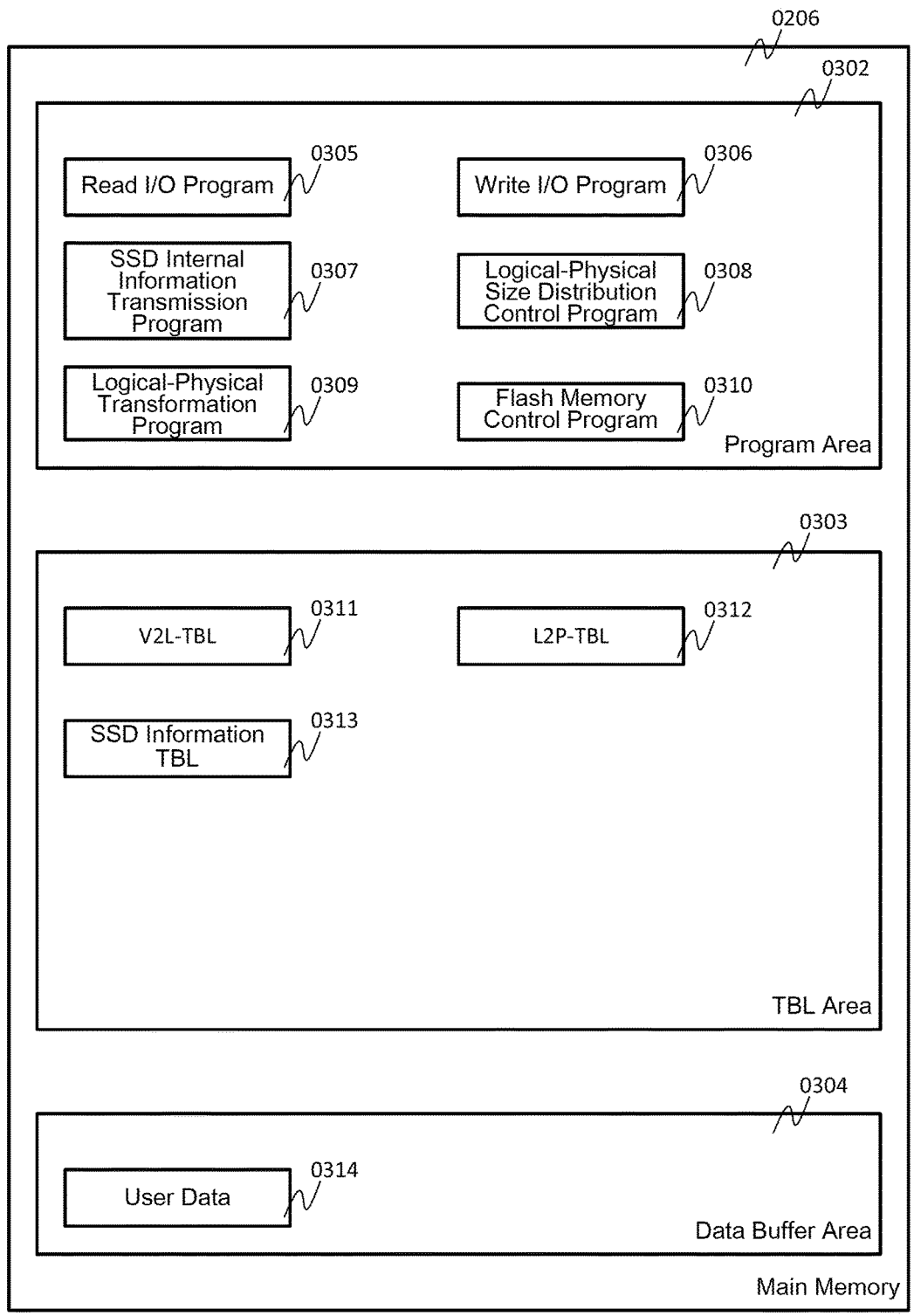
FIG. 3 is a view illustrating a configuration example of a main memory 0206.

FIG. 3 is a view illustrating a configuration example of the main memory 0206. The main memory 0206 has a program area 0302, a TBL area 0303, and a data buffer area 0304. The program area 0302 and the TBL area 0303 are areas storing programs and various tables for controlling the SSD 0100. The data buffer area 0304 is an area used for storing the user data temporarily.

The program area 0302 has a read I/O program 0305, a write I/O program 0306, an SSD internal information transmission program 0307, a logical-physical size distribution control program 0308, a logical-physical transformation program 0309, and an FM control program 0310.

The read I/O program 0305 is a program that processes read requests from the superior device 0101. The write I/O program 0306 is a program for processing write requests from the superior device 0101. The SSD internal information transmission program 0307 is a program that transmits the internal information of the SSD to the superior device 0101. The logical-physical size distribution control program 0308 is a program that selects an appropriate logical-physical size and controls the translation of virtual address and logical address. The logical-physical transformation program 0309 is a program that processes the translation of logical address and physical address. The FM control program 0310 is a program that controls the reading, writing and erasing performed to the FM.

The TBL area 0303 has a V2L (Virtual Address To Logical Address)-TBL 0311, an L2P (Logical Address To Physical Address)-TBL 0312, and an SSD information TBL 0313. The V2L-TBL 0311 is a table that stores information related to the mapping of virtual address and logical address. The L2P-TBL 0312 is a table that stores information related to the mapping of logical address and physical address. The SSD information TBL 0313 is a table that stores information related to the SSD, such as the capacity and the selectable logical-physical size. The data buffer area 0304 temporarily stores user data 0314 according to the read request or the write request. The user data 0314 is data handled by the superior device 0101.

Figure 4:
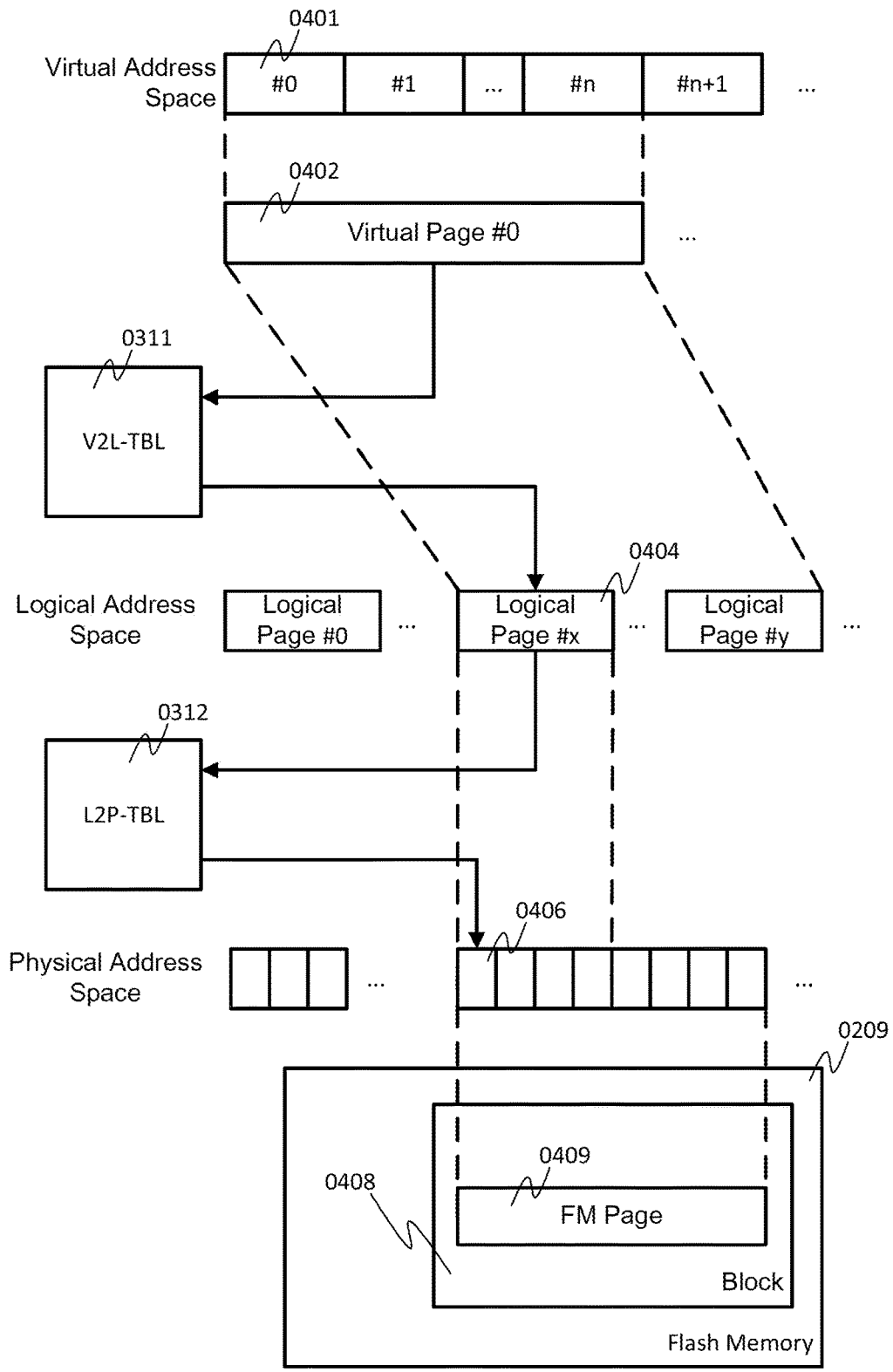
FIG. 4 is a view illustrating a correspondence of virtual address space, logical address space and physical address space.

FIG. 4 is a view showing the correspondence between virtual address space, logical address space and physical address space. The FM 0209 has one or more blocks 0408. A virtual address space 0401 is an address space provided to the superior device 0101.

A virtual page 0402 is composed of one or more logical pages 0404, which is mapped by the V2L-TBL 0311. The logical page 0404 is composed of one or more physical pages 0406, which is mapped by the L2P-TBL 0312. The physical page 0406 is mapped to one or more FM pages 0409. The block 0408 is a unit for erasing data in the FM 0209, and has one or more FM pages 0409. The FM page 0409 is a read/write unit of data in the FM 0209.

FIG. 5 is a view showing a configuration example of the V2L-TBL 0311. The information managed by the V2L-TBL 0311 is mainly the mapping information between virtual and logical addresses, which is used for determining the allocation of appropriate logical-physical size. The V2L-TBL 0311 has, for each virtual page, a virtual page #0502, an allocation state 0503, a logical-physical size 0504, an initial logical page #0505, a number of allocated pages 0506, a write throughput 0507, an average write size 0508, and a rate of write smaller than logical-physical size 0509.

The virtual page #0502 is an identifier of a virtual page, which is a unique number. The allocation state 0503 indicates whether the relevant virtual page is already allocated to a logical page or not (allocated/not allocated). The logical-physical size 0504 indicates the logical-physical size of the logical page allocated to the virtual page. The initial logical page #0505 indicates an initial # of a logical page allocated to a virtual page. The number of allocated pages 0506 indicates the number of logical pages allocated to the virtual page.

The write throughput 0507 indicates the write throughput from the superior device 0101 to the relevant virtual page. The update of the write throughput 0507 is executed in an arbitrary unit time, and can be calculated not based on all writes but based on the result of sampling. The average write size 0508 shows the average write size of the relevant virtual page from the superior device 0101. The update of the average write size 0508 is executed in an arbitrary unit time, and can be calculated not based on all writes but based on the result of sampling.

The rate of write smaller than logical-physical size 0509 indicates the rate of the size of the write request from the superior device 0101 to the relevant virtual page being smaller than the logical-physical size. The update of the rate of write smaller than logical-physical size 0509 is executed in an arbitrary unit time, and can be calculated not based on all writes but based on the result of sampling. In FIG. 5, only the rate of write smaller than the logical-physical size with respect to the allocated logical-physical size is stored, but in order to realize a more effective selection of logical-physical size, it is possible to store the rate of write smaller than the logical-physical size with respect to multiple or all selectable logical-physical sizes.

Figure 6:
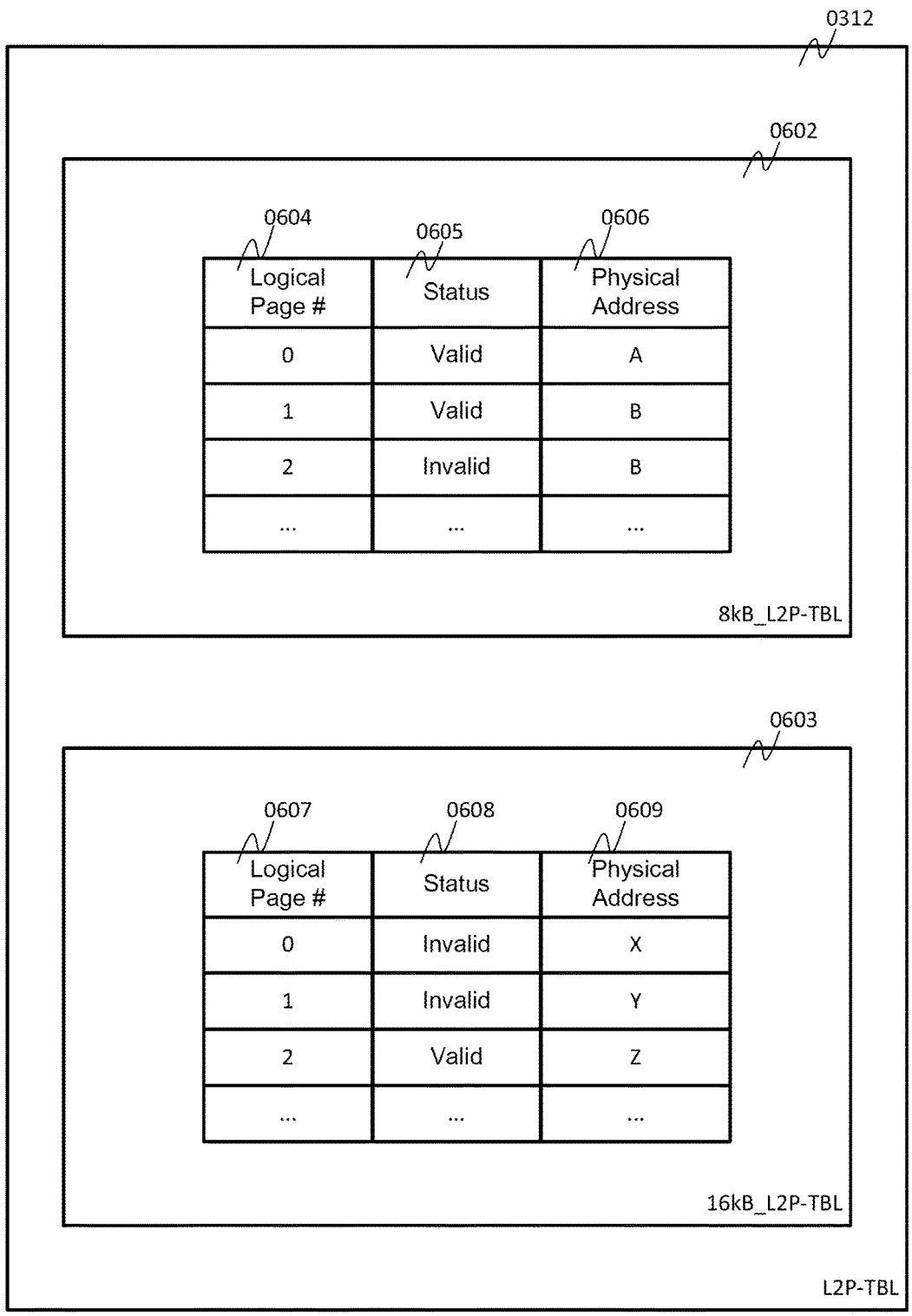
FIG. 6 is a view illustrating a configuration example of a L2P-TBL 0312.

FIG. 6 is a view showing a configuration example of the L2P-TBL 0312. In the example, the information managed by the L2P-TBL 0312 is mainly used for mapping the logical and physical addresses. The L2P-TBL 0312 has an 8 kB_L2P-TBL 0602 and a 16 kB_L2P-TBL 0603.

The information managed by the 8 kB_L2P-TBL 0602 include a logical page #0604, a status 0605 and a physical address 0606. The logical page #0604 is an identifier of a logical page, and it is a unique number. The status 0605 indicates whether a reference destination physical address of the relevant logical page is valid or not (invalid). The physical address 0606 indicates an initial physical address allocated to the relevant logical page. The information managed by the 8 kB_L2P-TBL 0603 are a logical page #0607, a status 0608 and a physical address 0609, and it is of the same type as the aforementioned 8 kB_L2P-TBL.

FIG. 7 is a view illustrating a configuration example of the SSD information TBL 0313. The information managed by the SSD information TBL 0313 is mainly used when transmitting SSD information to the superior device 0101. The SSD information TBL 0313 includes a device capacity 0702, a corresponding logical-physical size 0703, and a logical-physical size allocation rate 0704.

The device capacity 0702 illustrates the capacity that the SSD 0100 provides to the superior device 0101. The corresponding logical-physical size 0703 indicates the logical-physical size selectable by the SSD 0100. The logical-physical size allocation rate 0704 indicates the respective logical-physical size allocation rate to the device capacity 0702.

Figure 8:
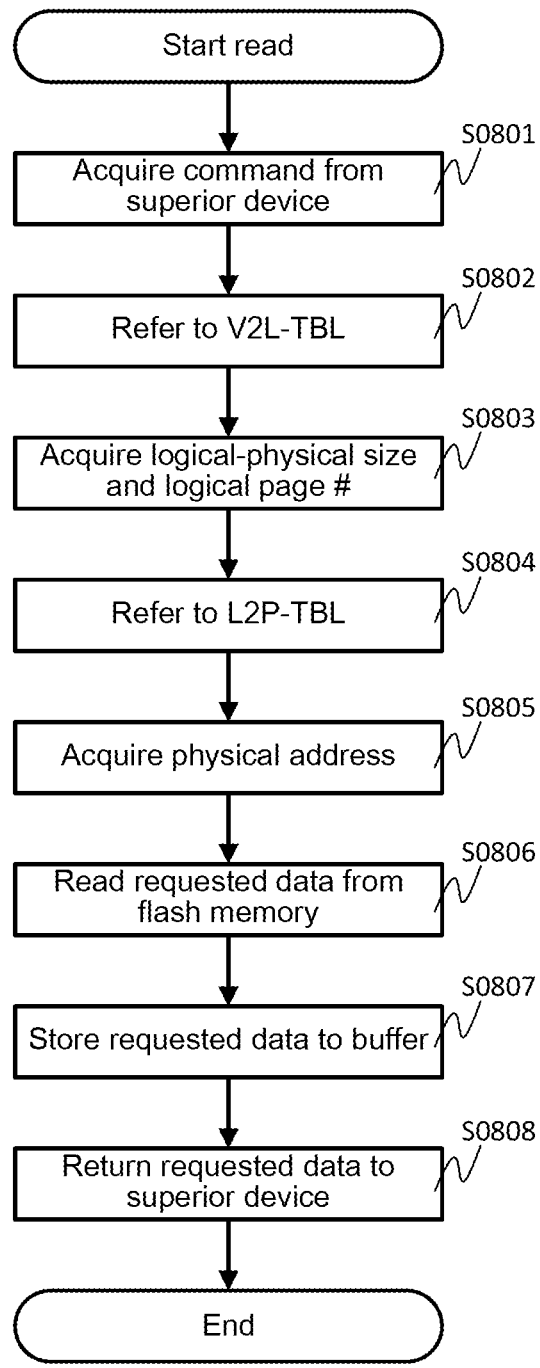
FIG. 8 is a sequence diagram illustrating one example of a process flow from a state where a read request is issued from a superior device 0101 to a state where the read request is completed.

FIG. 8 is a sequence diagram illustrating one example of the flow of the process from a state in which a read request is issued from the superior device 0101 to a state in which the read request is completed. The subject of the process is described as the SSD 0100, but the SSD controller 0203 or the CPU 0205 can also be the subject. The same applies for the subsequent description of processes.

The SSD 0100 acquires a command including a read request from the superior device 0101 (S0801).

After analyzing the command, the SSD 0100 refers to the information related to the virtual page corresponding to the requested data from the V2L-TBL 0311 (S0802). After analyzing the command, the SSD 0100 computes the virtual page #0502 corresponding to the request data from the virtual address, and refers to the related information from the V2L-TBL 0311 (S0802).

The SSD 0100 acquires the logical-physical size 0504 and the logical page # corresponding to the requested data from the V2L-TBL 0311. The logical page # can be computed from the initial logical page #0505 (S0803).

Based on the logical-physical size 0504 and the logical page # acquired in S0803, the SSD 0100 refers to the related information from the L2P-TBL 0312 (S0804), and acquires the relevant physical address (S0805).

The SSD 0100 issues a read request to the FM 0209 based on the physical address acquired in S0805, and waits for read complete (S0806).

After the read issued in S0806 is completed, the SSD 0100 stores the read data to the data buffer area 0304 (S0807).

The SSD 0100 transmits the requested data and read completion response to the superior device 0101, and completes the read processing (S0808).

Figure 9:
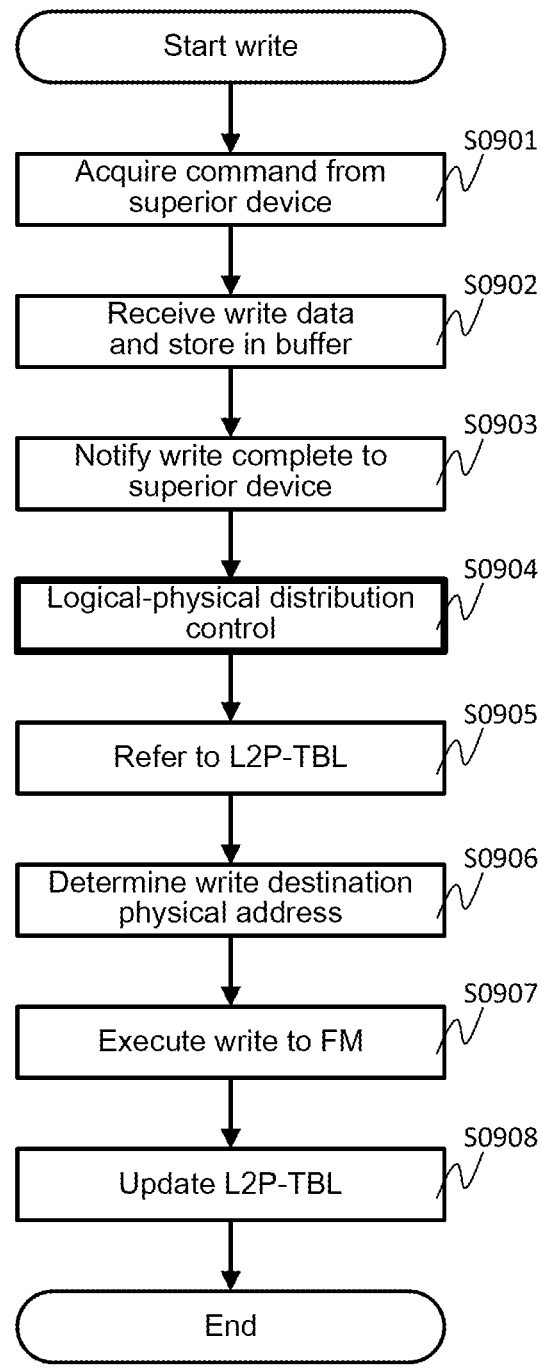
FIG. 9 is a sequence diagram illustrating one example of a process flow from a state where a write request is issued from the superior device 0101 to a state where the write request is completed.

FIG. 9 is a sequence view illustrating one example of the flow of the process from a state in which a write request is issued from the superior device 0101 to the completion of the write request.

The SSD 0100 acquires a command including a write request from the superior device 0101 (S0901).

After analyzing the command, the SSD 0100 requests write data to the superior device 0101, and stores the received write data to the data buffer area 0304 (S0902). The SSD 0100 transmits a write complete response to the superior device 0101 (S0903).

In the logical-physical allocation control, the SSD 0100 executes new allocation or reallocation of virtual pages, and refers to or updates the V2P-TBL 0311 (S0904). The details of the present process S0904 will be described later.

The SSD 0100 refers to the related information in the L2P-TBL 0312 based on the logical-physical size 0504 and the logical page # acquired in S0904 (S0905), and determines the physical address of the data write destination (S0906). The determination of the physical address can be managed using a table storing information determining a degree of deterioration of FM, such as the number of times of erase in units of blocks or pages.

The SSD 0100 issues a write request to the FM 0209 based on the physical address acquired in S0906, and waits for write complete (S0907).

After the write issued in S0907 is completed, the SSD 0100 updates the physical address of the relevant entry of the L2P-TBL 0312, and ends the process (S0908).

Figure 10:
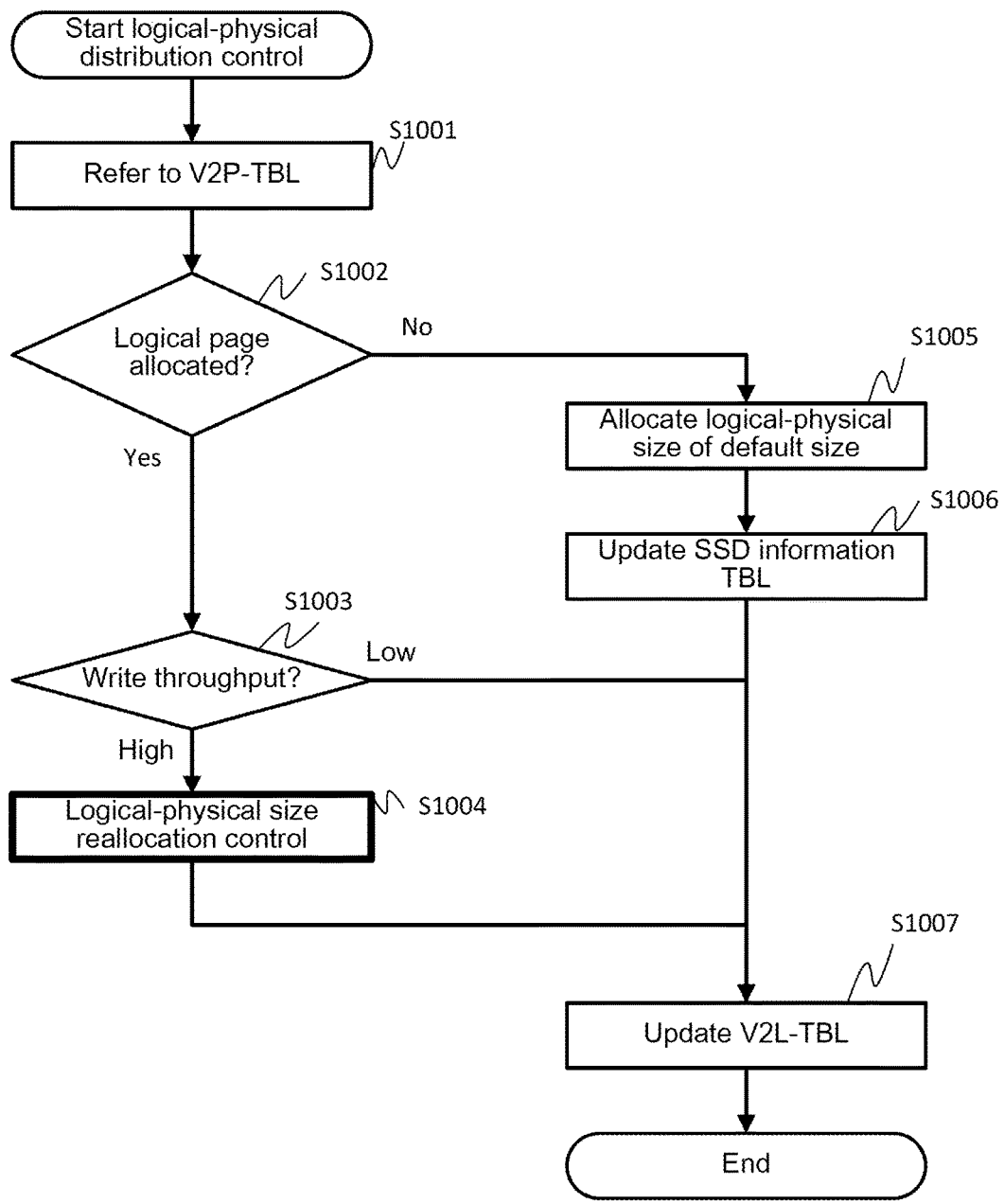
FIG. 10 is a sequence diagram illustrating one example of a logical-physical distribution control S0904.

FIG. 10 is a sequence diagram illustrating one example of a logical-physical distribution control S0904.

The SSD 0100 refers to information related to a virtual page corresponding to write data in the V2L-TBL 0311 (S1001).

The SSD 0100 determines whether a logical page is allocated to the relevant virtual page based on the allocation state 0503 referred to in S1001 (S1002). If it is determined that a logical page is not allocated (S1002: No), a logical page of a default logical-physical size is allocated (S1005), and the logical-physical size allocation rate 0704 of the SSD information TBL 0313 is updated (S1006). Thereafter, the allocation state 0503, the logical-physical size 0504, the initial logical page #0505, the number of allocated pages 0506, the write throughput 0507, the average write size 0508, and the rate of write smaller than logical-physical size 0509 of the V2L-TBL 0311 are updated (S1007), and the process is ended.

On the other hand, if it is determined in S1002 that a logical page is allocated to the relevant virtual page (S1002: Yes), the SSD 0100 executes S1003.

The SSD 0100 determines whether write throughput in the relevant virtual page is high or low based on the write throughput 0507 referred to in S1001 (S1003). Whether the write throughput is high or low can be determined by setting a threshold value in advance, or based on a relative value with other virtual pages. If it is determined that the write throughput is low (S1003: Low), the write throughput 0507, the average write size 0508, and the rate of write smaller than logical-physical size 0509 of the V2L-TBL 0311 are updated (S1007), and the process is ended.

On the other hand, if the write throughput of the relevant virtual page is high as a result of determination of S1003 (S1003: High), the SSD 0100 executes S1004.

After executing a logical-physical size reallocation control (S1004), the SSD 0100 ends the process. The details of the present logical-physical size reallocation control will be described later.

In the present embodiment, the logical-physical distribution control S0904 is executed only in the write sequence, but it can also be executed in the read sequence of FIG. 8. In that case, the logical-physical distribution control S0904 is executed in the process of V2L-TBL 0311 reference process S0802. Further, the logical-physical distribution control S0904 executes logical-physical reallocation control S1004 only in a state where write throughput is high, but it can also be executed when the read throughput is high. In that case, the V2L-TBL 0311 includes read throughput and average read size as management information, and updates the present management information in S1007.

Figure 11:
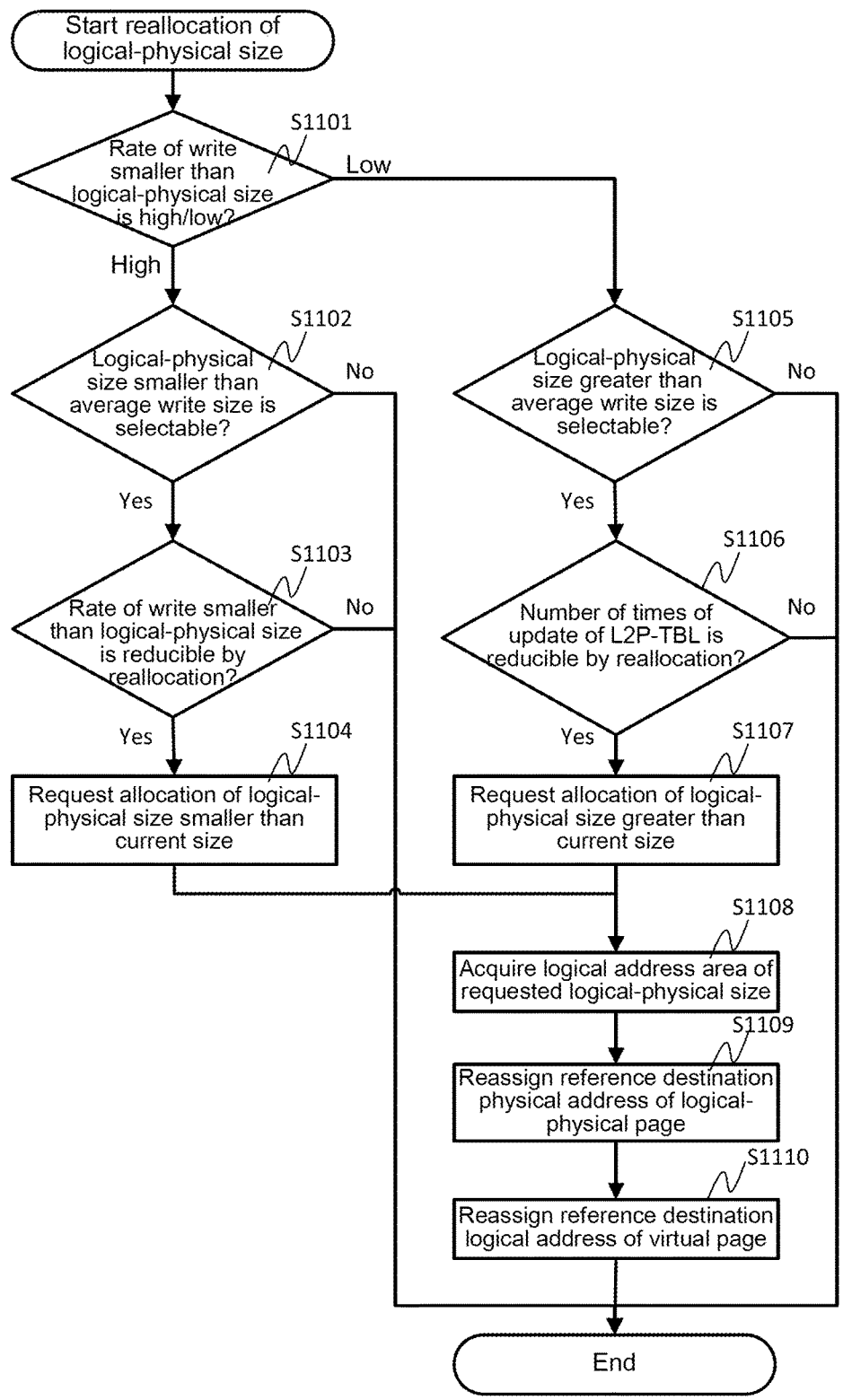
FIG. 11 is a sequence diagram illustrating one example of a logical-physical size reallocation control S1004.

FIG. 11 is a sequence diagram illustrating one example of the logical-physical size reallocation control S1004.

The SSD 0100 determines whether the rate of write smaller than logical-physical size in the relevant virtual page is high or low based on the rate of write smaller than logical-physical size 0509 referred to in S1001 (S1101). Whether the rate of write smaller than logical-physical size is high or low can be determined by setting a threshold value in advance, or based on a relative value with other virtual pages. If it is determined that the rate of write smaller than logical-physical size is low (S1101: Low), the SSD 0100 executes S1105 (A). On the other hand, if the rate of write smaller than logical-physical size is determined to be high (S1101: High) the SSD 0100 executes S1102 (B).

Based on (B) (S1101: High), the SSD 0100 determines whether a logical-physical size smaller than an average write size is selectable in the relevant virtual page based on the average write size 0508 referred to in S1001 and the corresponding logical-physical size 0703 in the SSD information TBL 0313 (S1102). As a result, if it is determined that a logical-phase size smaller than the average write size 0508 is not selectable (S1102: No), the SSD 0100 ends the process.

On the other hand, if it is determined that a logical-physical size smaller than the average write size 0508 is selectable in the relevant virtual page (S1102: Yes), the SSD 0100 executes S1103. The SSD 0100 determines whether the current rate of write smaller than logical-physical size 0509 is reducible by reallocation of the logical-physical size, based on the logical-physical size 0504, the average write size 0508 and the rate of write smaller than logical-physical size 0509 referred to in S1001, and the corresponding logical-physical size 0703 of the SSD information TBL 0313 (S1103). For example, in a case where the logical-physical size 0504 is 16 kB, the average write size 0508 is 10 kB and the rate of write smaller than logical-physical size 0509 is 80%, the rate of write smaller than logical-physical size 0509 is reducible by allocating an 8-kB logical-physical size. Whether the rate of write smaller than logical-physical size 0509 is reducible can be determined by setting a threshold value in advance, and determining that the rate can be reduced in cases where the threshold value is exceeded. If it is determined that the rate of write smaller than logical-physical size 0509 is not reducible (S1103: No), the SSD 0100 ends the process.

On the other hand, if it is determined that the current rate of write smaller than logical-physical size 0509 is reducible by reallocation of the logical-physical size (S1103: Yes), the SSD 0100 requests allocation of a logical-physical size smaller than the current size (S1104), and executes S1108 (C).

Based on (A) (S1101: Low), the SSD 0100 determines whether a logical-physical size greater than the average write size 0508 is selectable in the relevant virtual page based on the average write size 0508 referred to in S1001, and the corresponding logical-physical size 0703 of the SSD information TBL 0313 (S1105). As a result of the determination, if a logical-physical size smaller than the average write size is not selectable (S1105: No), the SSD 0100 ends the process.

On the other hand, if it is determined that a logical-physical size greater than the average write size is selectable in the relevant virtual page (S1105: Yes), the SSD 0100 executes S1106. The SSD 0100 determines whether the number of times of update of the L2P-TBL 0312 is reducible by reallocating the logical-physical size, based on the logical-physical size 0504, the average write size 0508 and the rate of write smaller than logical-physical size 0509 referred to in S1001, and the corresponding logical-physical size 0703 of the SSD information TBL 0313 (S1106). For example, in a case where the logical-physical size 0504 is 8 kB, the average write size 0508 is 32 kB and the rate of write smaller than logical-physical size 0509 is 1%, it means that there is hardly any access of 8 kB or smaller, and that most accesses are 16 kB or greater, so that the number of times of update of the L2P-TBL 0312 is reducible by allocating a 16-kB logical-physical size. Whether the number of times of update of the L2P-TBL 0312 is reducible can be determined by setting a threshold value in advance, and determining that the number can be reduced in cases where the threshold value is exceeded. If it is determined that the number of times of update of the L2P-TBL 0312 is not reducible (S1106: No), the SSD 0100 ends the process.

On the other hand, if it is determined that the number of times of update of L2P -TBL is reducible by reallocating the logical-physical size (S1103: Yes), the SSD 0100 requests allocation of a logical-physical size greater than the current size (S1104), and executes S1108 (C).

Based on (C) (S1104 or S1107), the SSD 0100 receives the reallocation request of the logical-physical size from either S1104 or S1107, and allocates a logical address area (one or more continuous logical pages) corresponding to the requested logical-physical size (S1108).

The SSD 0100 reassigns (changes) the reference destination physical address of the logical page allocated to the relevant virtual page (old logical page) so that it can be referred to from the logical page stored in S1008 (new logical page) (S1109). Specifically, the relevant physical address entry of the L2P-TBL 0312 is updated so as to rewrite the reference destination physical address of the new logical page to the reference destination physical address of the old logical page. Since it is necessary for the physical address to be continuous in logical page units, there are cases where copying of data among pages/blocks of the FM becomes necessary during the reallocation process to a greater logical-physical size.

The SSD 0100 reassigns (updates) the reference destination logical address of the relevant virtual page to a new logical page of S1109, and frees the old logical page (S1110). Specifically, the relevant initial logical page # and the entry of number of logical pages are updated so that the relevant virtual page refers to the new logical page, and at the same time, the status of the relevant logical page in the L2P-TBL 0312 of the old logical page is updated to invalid, and the process is ended.

The present example illustrates a sequence of the logical-physical reallocation control S1004 executed in a case where write throughput is determined to be high in S1003. On the other hand, as described in the description of FIG. 10, the logical-physical size reallocation control S1004 can also be executed when it is determined that read throughput is high. According to the logical-physical size reallocation control S1004 executed in the case where read throughput is determined to be high, reallocation of a logical-physical size greater than the current size is executed in a state where it is determined that a logical-physical size greater than the average read size is selectable and the number of times of reference of the L2P-TBL 0312 is reducible by reallocation.

As described, according to the first embodiment of the present invention, an appropriate logical-physical size corresponding to the I/O size can be utilized in the SSD using the hierarchical logical-physical system, and the ratio in which the logical-physical management information is stored in the main memory can be increased by reducing the amount of logical-physical management information. Thereby, it becomes possible to either reduce or eliminate the frequency of logical-physical miss, and to suppress the deterioration of system performance of the hierarchical logical-physical system. Furthermore, the number of times of reference and update of the logical-physical management information in the logical-physical transformation process can be reduced by selecting an appropriate logical-physical size, and the system performance can be improved.

[Second Embodiment]

The second embodiment relates to a case where the SSD of the first embodiment is loaded to a storage subsystem having a capacity virtualization function.

Capacity virtualization function is one of the functions of the storage subsystem. Capacity virtualization is a technique providing a virtual capacity that is greater than a physical capacity of a storage subsystem as virtual volume to the host computer. In capacity virtualization, at first, a plurality of drives within the storage system are gathered to form a pool, and the storage areas within the pool are managed in units called extents having a predetermined size. The storage system allocates extents to the areas within the virtual volume specified by the write request in accordance with the write request issued from the host computer to the virtual volume. Thereby, the user can suppress the physical capacity of the drive to a minimum in accordance with the purpose of use of respective occasions, by which costs can be cut down.

Figure 12:
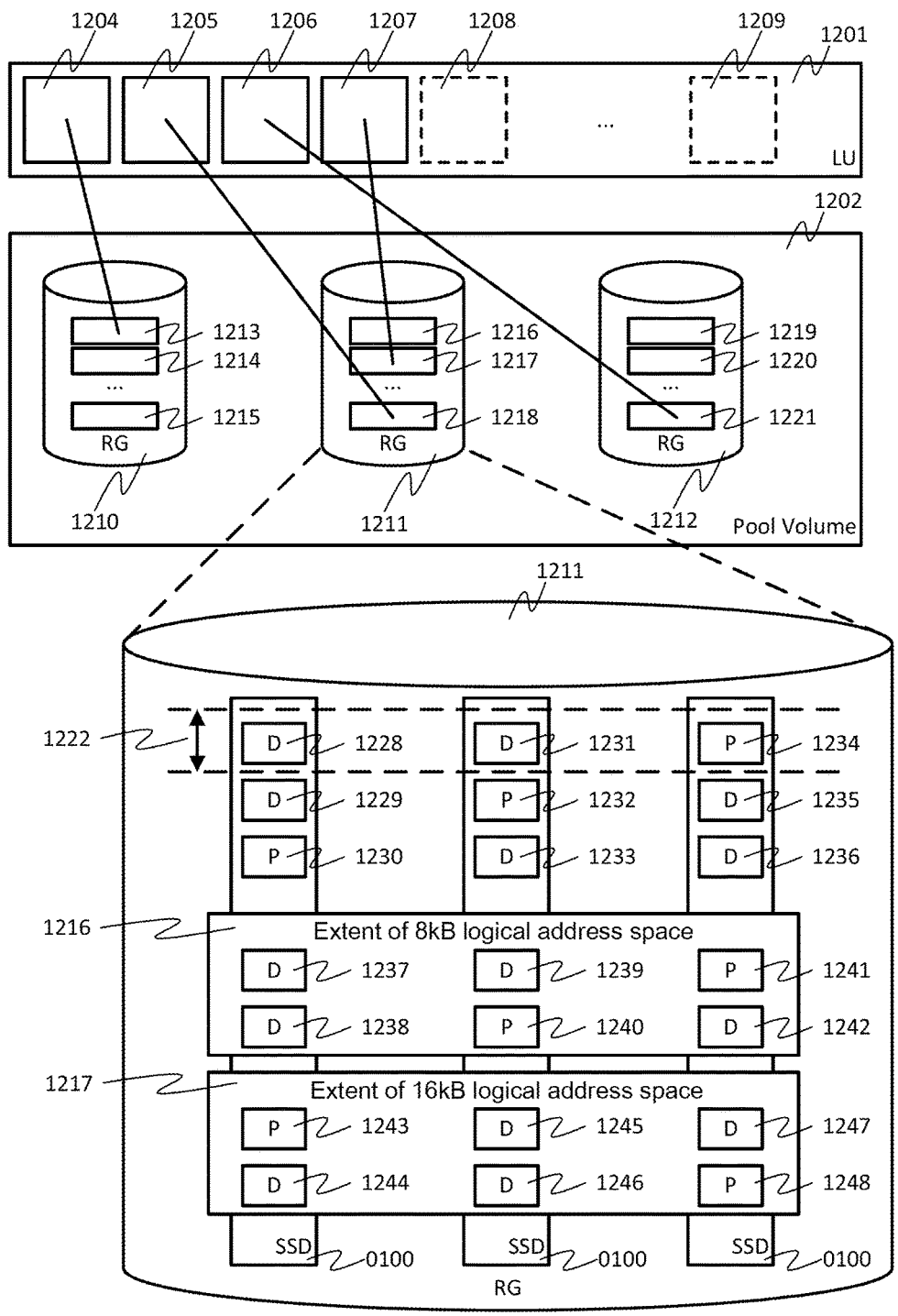
FIG. 12 is a view illustrating an outline of a second embodiment.

Next, the outline of the second embodiment will be described. FIG. 12 is a view illustrating an outline of the second embodiment. A RAID group (RG) is configured of a single type of drives (in this example, the SSD 0100). A pool volume 1202 is configured of one or more RGs. An extent refers to a storage area obtained by dividing the pool volume 1202. In the present example, the pool volume 1202 is configured of RG 1201, RG 1211 and RG 1212.

The RG 1211 will now be described. The RG 1211 is configured of three SSDs 0100. Further, the RG 1211 configures RAID5, wherein the data (D) and parity (P) are stored in stripe lines based on three SSDs 0100. Each stripe line is formed across a plurality of drives configuring the same RG. For example, a stripe line 1222 is configured of D1228, D1231 and P1234.

We will now describe the configuration of the extent. Each extent is configured of one or more stripe lines. For example, extent 1216, extent 1217 and extent 1218 are created in the RG 1211. The extent 1216 is configured of two stripe lines each having a logical-physical size of 8 kB (a stripe line composed of data 1237, data 1239 and parity 1241, and a stripe line composed of data 1238, parity 1240 and data 1242). Further, the extent 1217 is configured of two stripes lines each having a logical-physical size of 16 kB (a stripe line composed of parity 1243, data 1245 and data 1247, and a stripe line composed of data 1244, data 1246 and parity 1248). Further, although not illustrated, the extent 1218 is also configured of stripes lines having a logical-physical size of 16 kB. The storage subsystem configures the extents so that logical-physical sizes can be selected in units of extents.

An LU 1201 is a virtual logical volume that a computer (such as the superior device 0101) connected to a storage subsystem uses for storing user data. The capacity provided as the LU 1201 can be set as a storage capacity greater than the total capacity of storage media provided in the storage subsystem. The LU 1201 is configured of an arbitrary number of virtual extents 1204 through 1209. In the drawing, one extent corresponds to one virtual extent, but it is also possible to have a plurality of extents correspond to one virtual extent. The LU 1201 has a virtual address (logical address configuring a virtual volume), and the virtual extent is configured by dividing the virtual address into predetermined areas.

It is possible to configure the RG 1201 or the RG 1212 with a storage media (such as an HDD) that differs from the RG 1211, and to configure the LU 1201 with an extent provided from a different storage media. Further, the present arrangement can be applied to a storage subsystem having a hierarchy reallocation function of allocating the extents cut out from different storage media based on the access frequency of the LU to the respective virtual extents.

The virtual extents 1204 through 1207 illustrated by the solid line are virtual extents having extents allocated from the RGs 1201 through 1202. In other words, for example, an extent 1217 is allocated to a virtual extent 1205 and an extent 1218 is allocated to a virtual extent 1207. As described, extents having the same logical-physical size are allocated to the virtual logical volume LU 1201. The virtual extents 1208 and 1209 illustrated by dotted lines are unallocated.

In the present embodiment, the SSD 0100 installed in the storage subsystem having a capacity virtualization function divides the address space (LBA) provided to the storage subsystem having the capacity virtualization function into a plurality of areas, and allocates different logical-physical sizes thereto, instead of distributing the logical-physical sizes within the SSD 0100 as according to the first embodiment. The division of areas and the logical-physical sizes allocated to each area can be set or reset at arbitrary timings by the storage subsystem having the capacity virtualization function and the storage subsystem is equipped with an interface realizing the function. Further, the storage subsystem having the capacity virtualization function manages the extents cut out from one or more SSDs 0100 according to logical-physical sizes, monitors I/O patterns from the superior device, and performs control to allocate the extent having an appropriate logical-physical size to the virtual extent. That is, the logical-physical size distribution control that had been performed within the SSD 0100 according to the first embodiment is executed in units of extents at the storage subsystem side. Thereby, the performance of the SSD 0100 adopting the logical-physical hierarchical system can be improved by the same reason as the first embodiment, and the performance of the storage subsystem having the capacity virtualization function installing the SSD 0100 can be improved. The second embodiment does not perform distribution control of logical-physical size in the SSD 0100 as in the first embodiment, so that the SSD 0100 installed in the second embodiment does not have the logical-physical size distribution control program 0308 and the V2L-TBL 0311.

Figure 13:
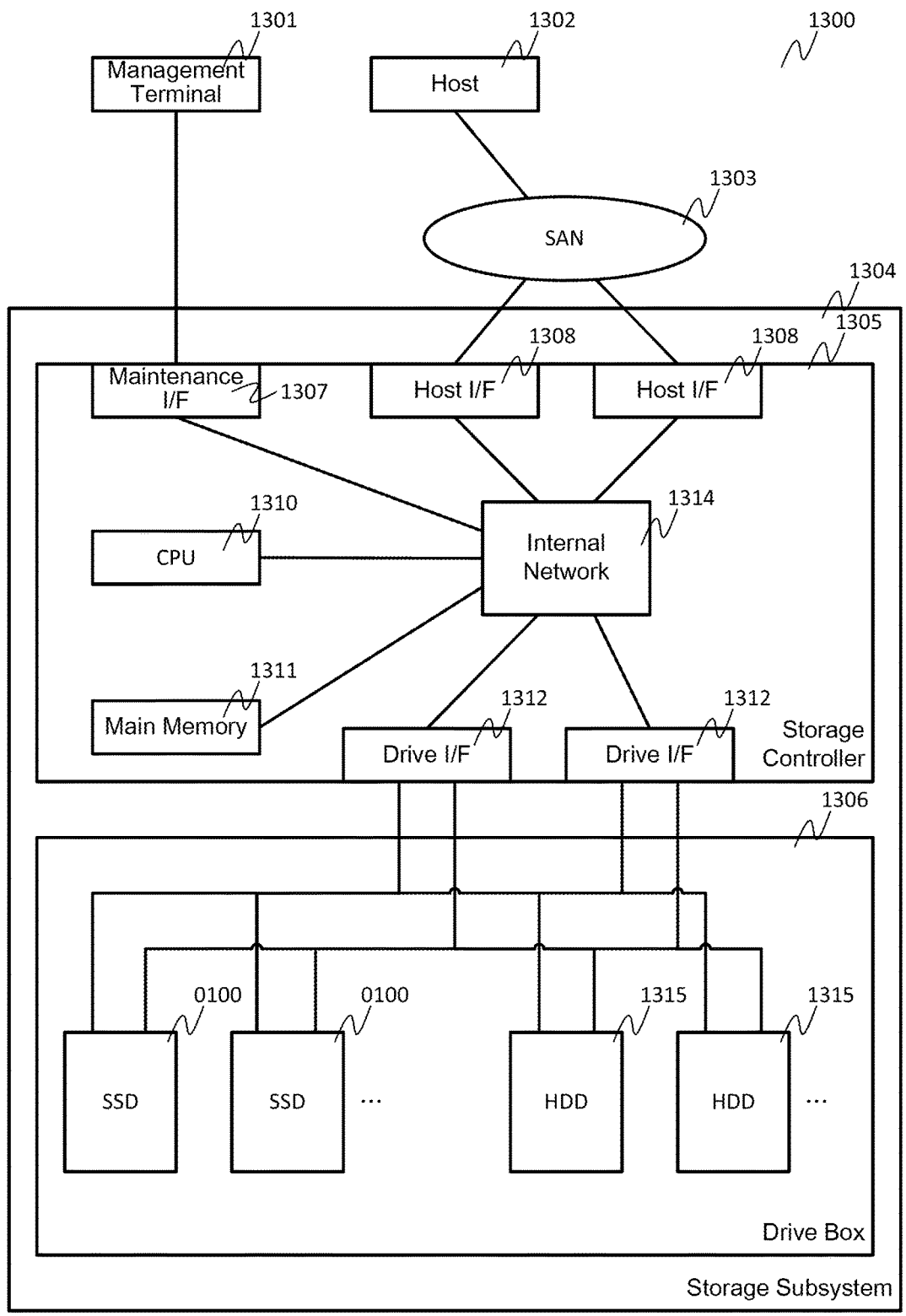
FIG. 13 is a view illustrating a configuration example of a storage system including a storage subsystem in which the SSD 0100 is installed.

FIG. 13 is a view illustrating a configuration example of a storage system including the storage subsystem having installed the SSD 0100. A storage system 1300 is equipped with a management terminal 1301, a host computer (hereinafter abbreviated as host) 1302, and a storage subsystem 1304.

The management terminal 1301 communicates via a dedicated maintenance I/F 1307 that differs from the host 1302. The management terminal 1301 issues a control command and the like to the storage subsystem 1304 by executing a control software for issuing a control command and the like to the storage subsystem 1304. The change of RAID level of the RAID group (RG) included in the storage subsystem 1304 and the like can be performed by the control command being executed in the storage subsystem 1304. The RAID group is a physical storage media group configured of multiple SSDs or HDDs, and stores data according to predetermined RAID levels. A computer different from the management terminal (such as the host 1302) can be used as the computer issuing a control command to the storage subsystem 1304.

The host 1302 is an example of a superior device utilizing the storage subsystem 1304. For example, the host 1302 is an application server. The host 1302 and the storage subsystem 1304 communicate via a SAN (Storage Area Network) 1303. For example, the SAN 1303 can include a fibre channel, a SCSI (Small Computer System Interface), an iSCSI (internet Small Computer System Interface), a USB (Universal Serial Bus), an IEEE 1394 bus, an SAS (Serial Attached SCSI) and so on. Other types of communication networks (such as a LAN (Local Area Network)) can be adopted instead of the SAN 1303. In FIG. 13, there is one host 1302 and one storage subsystem 1304, but at least one of them can be two or more.

The storage subsystem 1304 includes a storage controller 1305 and a drive box 1306 connected to the storage controller 1305. The storage controller 1305 controls the operation of the storage subsystem 1304. The storage controller 1305 has a communication I/F (the maintenance I/F 1307, a host I/F 1308 and a drive I/F 1312), a main memory 1311, and a CPU 1310 which is a control device connected thereto. It has a management terminal 1301 serving as a communication I/F device, a maintenance I/F 1307 serving as the communication I/F device, the host I/F 1308 serving as a frontend communication I/F device, and the drive I/F 1312 serving as a backend communication I/F device. The CPU 1310, the maintenance I/F 1307, the host I/F 1308, the CPU 1310, the main memory 1311 and the drive I/F 1312 are connected via a dedicated connect bus such as a PCI (Peripheral Component Interconnect) (Registered Trademark) to an internal network 1314, and they can communicate via the internal network 1314. The main memory 1311 is connected for example via a dedicated connect bus such as a DDR3 (Double Data Rate 3) to the internal network 1314.

The host I/F 1308 is an interface through which the storage subsystem 1304 connects with the SAN 1303. The internal network 1314 is a network mutually connecting devices existing within the storage subsystem 1304. The internal network 1314 includes a switch. ASICs having a switch function or an assist function such as DMA (Direct Memory Access) transfer and RAID operation can be used instead of the internal network 1314.

The CPU 1310 controls the whole storage subsystem 1304. There are multiple CPUs 1310, and one CPU includes multiple processor cores. The multiple processor cores or CPUs 1310 can either cooperate or share operations to control the storage subsystem 1304. The main memory 1311 is an area in which the CPU 1310 stores computer programs and data necessary to control the storage subsystem 1304.

The drive I/F 1312 is an interface connecting the storage controller 1305 and a drive box 1306. The drive box 1306 includes a plurality of different types of drives, such as SSDs 0100 and HDDs 1315. The RAID group is configured of the same types of drives. Logical volumes as storage space of user data are provided from the respective RAID groups. In the drawing, SSDs 0100 and HDDs 1315 are illustrated as drives configuring the drive box 1306, but the HDD 1315 can be omitted.

Figure 14:
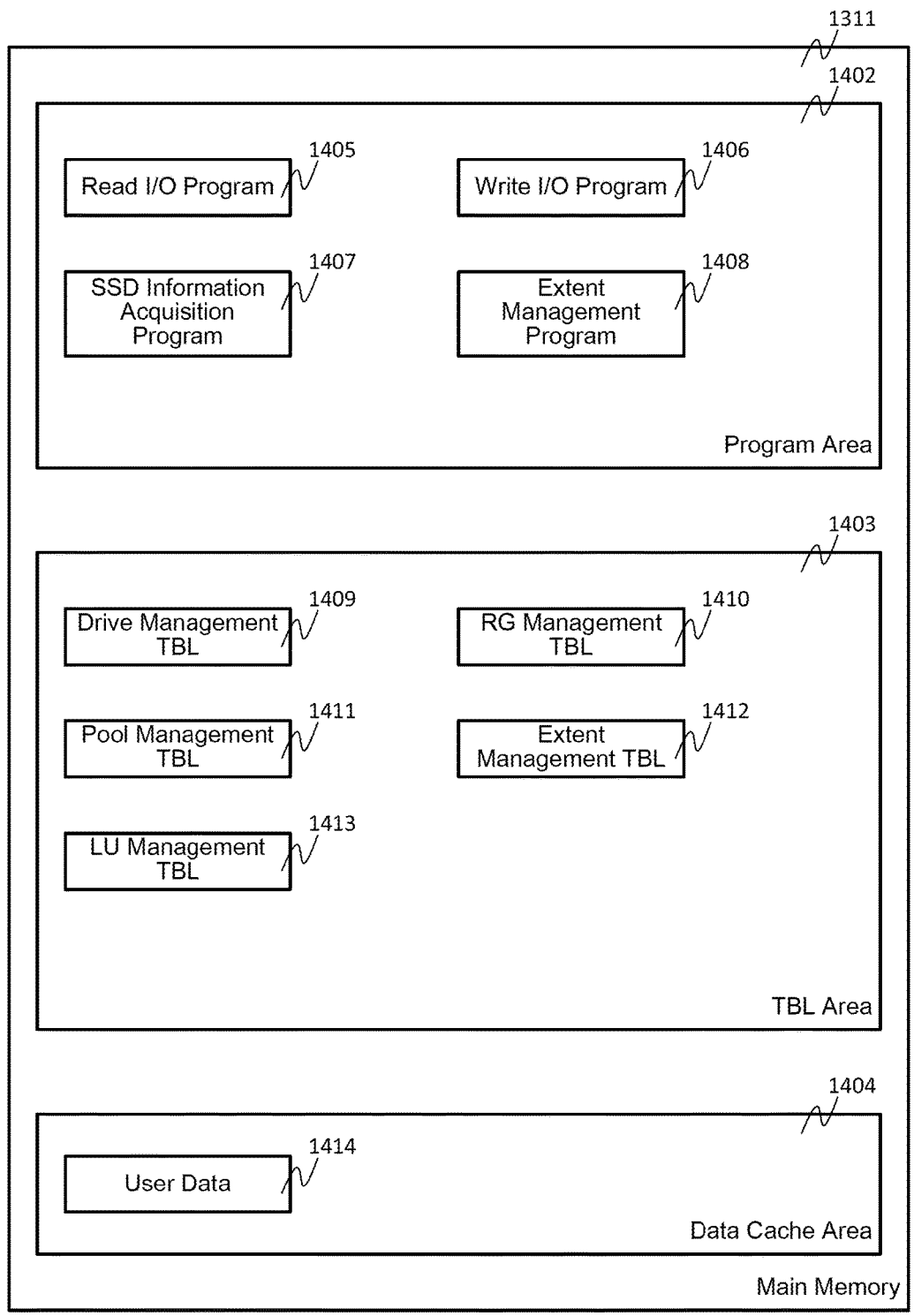
FIG. 14 is a view illustrating a configuration example of a main memory 1311.

FIG. 14 is a view illustrating a configuration example of the main memory 1311. The main memory 1311 includes a program area 1402, a TBL area 1403, and a data cache area 1404. The program area 1402 and the TBL area 1403 are areas in which programs for controlling the storage subsystem 1304 and various tables are stored. The data cache area 1404 is an area in which user data is stored temporarily.

The program area 1402 includes a read I/O program 1405, a write I/O program 1406, an SSD information acquisition program 1407, and an extent management program 1408. The read I/O program 1405 is a program that processes read requests from the host 1302. The write I/O program 1406 is a program that processes write requests from the host 1302. The SSD information acquisition program 1407 is a program that acquires SSD information from the SSD 0100. The extent management program 1408 is a program that processes allocation of extents.

The TBL area 1403 includes a drive management TBL 1409, an RG management TBL 1410, a pool management TBL 1411, an extent management TBL 1412, and an LU management TBL 1413. The drive management TBL 1409 is a table storing information related to drives stored in the drive box 1306. The RG management TBL 1410 is a table managing information related to RAID groups. The pool management TBL 1411 is a table storing information related to pool volumes. The extent management TBL 1412 is a table storing information related to extents. The LU management TBL 1413 is a table storing information related to LUs. The data cache area 1404 is an area in which user data 1414 corresponding to read requests and write requests is temporarily stored. The user data 1414 is data handled by the host 1302.

FIG. 15 is a view illustrating a configuration example of the drive management TBL 1409. The information managed by the drive management TBL 1409 is mainly used for managing the logical-physical size of respective areas in the logical spaces that the drives provide to the storage subsystem 1304. The drive management TBL 1409 includes, for each drive, a drive #1502, a drive type 1503, a capacity 1504, an 8-kB logical-physical space start address 1505, an 8-kB logical-physical space end address 1506, a 16-kB logical-physical space start address 1507, and a 16-kB logical-physical space end address 1508.

The drive #1502 is an identifier of drives, and it is a unique number. The drive type 1503 refers to the type of drives, such as SSD and HDD. The capacity 1504 refers to the total capacity of the drive. The 8-kB logical-physical space start address 1505 and the 8-kB logical-physical space end address 1506 indicate the area within the relevant drive in which an 8-kB logical-physical size is allocated. Similarly, the 16-kB logical-physical space start address 1507 and the 16-kB logical-physical space end address 1508 indicate the area within the relevant drive in which a 16-kB logical-physical size is allocated. The present figure only illustrate 8 kB and 16 kB sizes, but the drive management TBL 1409 includes other xxx-kB logical-physical space start address and xxx-kB logical-physical space end address (wherein xxx is an arbitrary natural number) corresponding to the number of selectable logical-physical sizes by the SSD.

FIG. 16 illustrates a configuration example of the RG management TBL 1410. The RG management TBL 1410 includes, for each RG, an RG #1602, a drive type 1603, a RAID level 1604, a RAID configuration 1605, and a drive #1606. The RG #1602 is an identifier of RG, which is a unique number. The drive type 1603 indicates the type of drive configuring the RG. The RG is configured of one type of drives.

The RAID level 1604 indicates the RAID level of the RG, which can be various values such as 1+0, 1, 3, 4, 5 and 6. The RAID configuration 1605 indicates the number of data drives (drives storing data) and the number of parity drives (drives storing parity) configuring the RAID. The drive #1606 indicates the drive numbers configuring the RG, and includes a number of valid numerical values corresponding to the RAID configuration 1605.

FIG. 17 is a view illustrating a configuration example of the pool management TBL 1411. The pool management TBL 1411 includes, for each pool, a pool #1702, a RG #1703, a RG remaining capacity 1704, and a pool remaining capacity 1705.

The pool #1702 is an identifier of pools, and it is a unique number. The RG #1703 indicates the RG number of the RG configuring the pool. The RG remaining capacity 1704 indicates the remaining capacity of each RG. The pool remaining capacity 1705 indicates the remaining capacity of each pool, and it is equivalent to the total value of the RG remaining capacity 1704 configuring the pool. Further, the RG remaining capacity 1704 and the pool remaining capacity 1705 are reduced when data write occurs to the extent unallocated area of the LU, and the values are updated to reduced values by the CPU 1310.

FIG. 18 is a view illustrating a configuration example of the extent management TBL 1412. The extent management TBL 1412 includes, for each extent, an extent #1802, an RG #1803, a size 1804, an allocation status 1805, a drive type 1806, a logical-physical size 1807, a write throughput 1808, an average write size 1809, a rate of write smaller than logical-physical size 1810, a drive #1811, a stripe #1812, a start LBA 1813, and an end LBA 1814.

The extent #1802 is an identifier of the extent, and it is a unique number. The RG #1803 indicates the number of the RG being the basis of the extent. The size 1804 indicates the capacity of the extent. The allocation status 1805 indicates whether the relevant extent is already allocated to the LU or not (allocated/not allocated). The drive type 1806 indicates the type of the drive included in the RG being the basis of the extent.

The logical-physical size 1807 indicates the logical-physical size of the relevant logical area of the drive included in the RG being the basis of the extent. The logical-physical sizes of the relevant logical areas of the drives included in the RG being the basis of the extent are the same. The write throughput 1808 indicates write throughput from the host 1302 to the relevant extent. The update of the write throughput 1808 is executed at an arbitrary unit time, and it can be computed based on all writes, or based on a result of sampling.

The average write size 1809 indicates an average write size from the host 1302 to the relevant extent. The update of the average write size 1809 is executed at an arbitrary unit time, and it can be computed based on all writes, or based on a result of sampling. The rate of write smaller than logical-physical size 1810 indicates the rate of the write request size from the host 1302 to the relevant virtual page being smaller than the logical-physical size. The update of the rate of write smaller than logical-physical size 1810 is executed at an arbitrary unit time, and it can be computed based on all writes, or based on a result of sampling. In FIG. 18, only the rate of write smaller than the logical-physical size with respect to the allocated logical-physical size is stored, but in order to realize a more effective selection of logical-physical size, the rate of write smaller than the logical-physical size with respect to a plurality of or all selectable logical-physical sizes can be stored.

The drive #1811 indicates based on which drive the relevant extent is created. The stripe #1812 indicates based on which stripe line the relevant extent is created. The start LBA 1813 and the end LBA 1814 indicate the start LBA and the end LBA of the stripe line that is used to create the space of the relevant extent.

FIG. 19 is a view illustrating a configuration example of the LU management TBL 1413. The LU management TBL 1413 includes, for each LU, an LU #1902, a virtual capacity 1903, a real capacity utilization 1904, a virtual extent #1905, and an assigned extent #1906.

The LU #1902 is an identifier of the LU, and it is a unique number. The virtual capacity 1903 is a virtual capacity of the LU. The virtual capacity is provided to the host 1302. The real capacity utilization 1904 is the total capacity of the extent actually allocated to the LU. The virtual extent #1905 indicates the identifiers of the virtual extents included in the LU. It indicates that LU #0 includes virtual extents 0 through n. The assigned extent #1906 indicates identifiers of the extents allocated to the LU.

Figure 20:
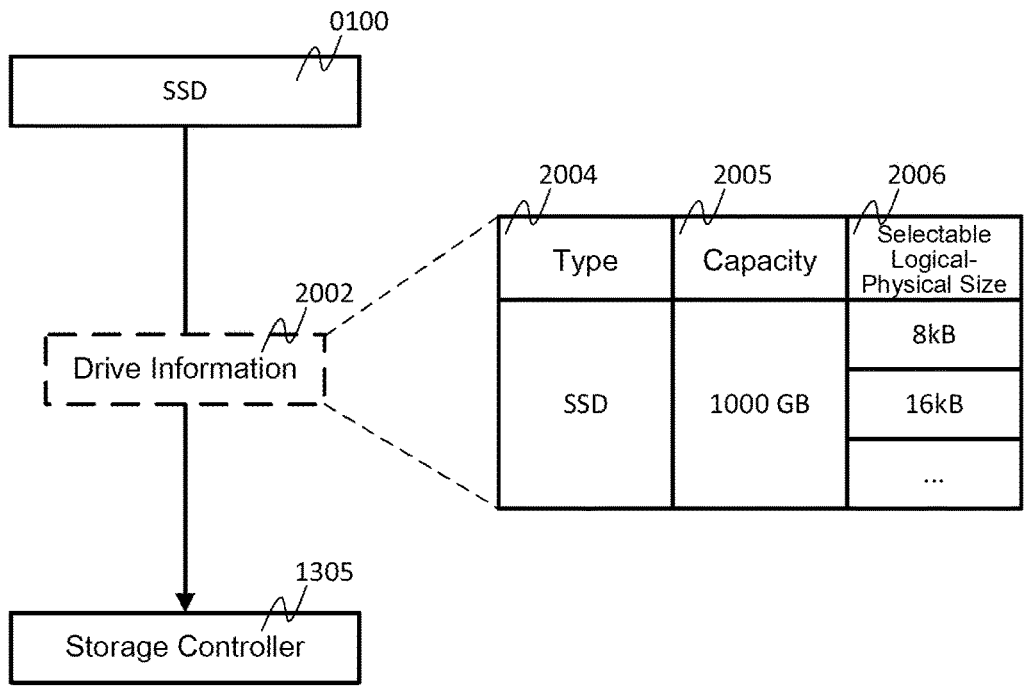
FIG. 20 is a view illustrating an example of a notification of drive information from the SSD to the storage controller.

FIG. 20 is a drawing illustrating one example of a notification of drive information from the SSD to the storage controller. A drive information 2002 is information transmitted from the SSD 0100 to a storage controller 1305, and it is used during configuration of the RG. The drive information 2002 includes a type 2004, a capacity 2005, and a selectable logical-physical size 2006.

The type 2004 indicates a drive type of the SSD 0100. The capacity 2005 indicates a device capacity of the SSD 0100. The selectable logical-physical size 2006 indicates logical-physical sizes selectable by the SSD 0100.

Figure 21:
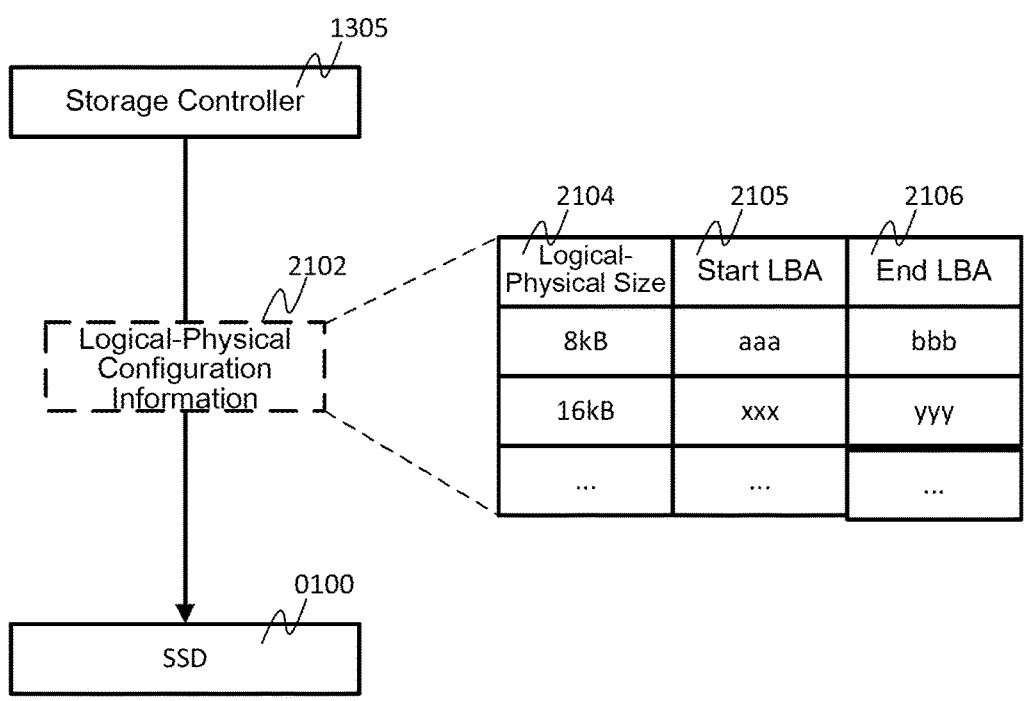
FIG. 21 is a view illustrating an example of logical-physical configuration information from the storage subsystem to the SSD.

FIG. 21 illustrates one example of a notification of drive information from the storage controller to the SSD. A logical-physical configuration information 2102 is information transmitted from the storage controller 1305 to the SSD 0100, and it is used during division of LBA of the SSD 0100 and setting/resetting of the respectively allocated logical-physical sizes. The logical-physical configuration information 2102 includes a logical-physical size 2104, a start LBA 2105, and an end LBA 2106.

The logical-physical size 2104 is equal to the selectable logical-physical size 2006 of the SSD 0100. The start LBA 2105 and the end LBA 2106 indicate the start LBA and the end LBA of the space in the SSD 0100 that is used as the relevant logical-physical size. In a state where the logical-physical configuration information 2102 is received, the SSD 0100 executes allocation of the logical-physical size based on the present invention.

Figure 22:
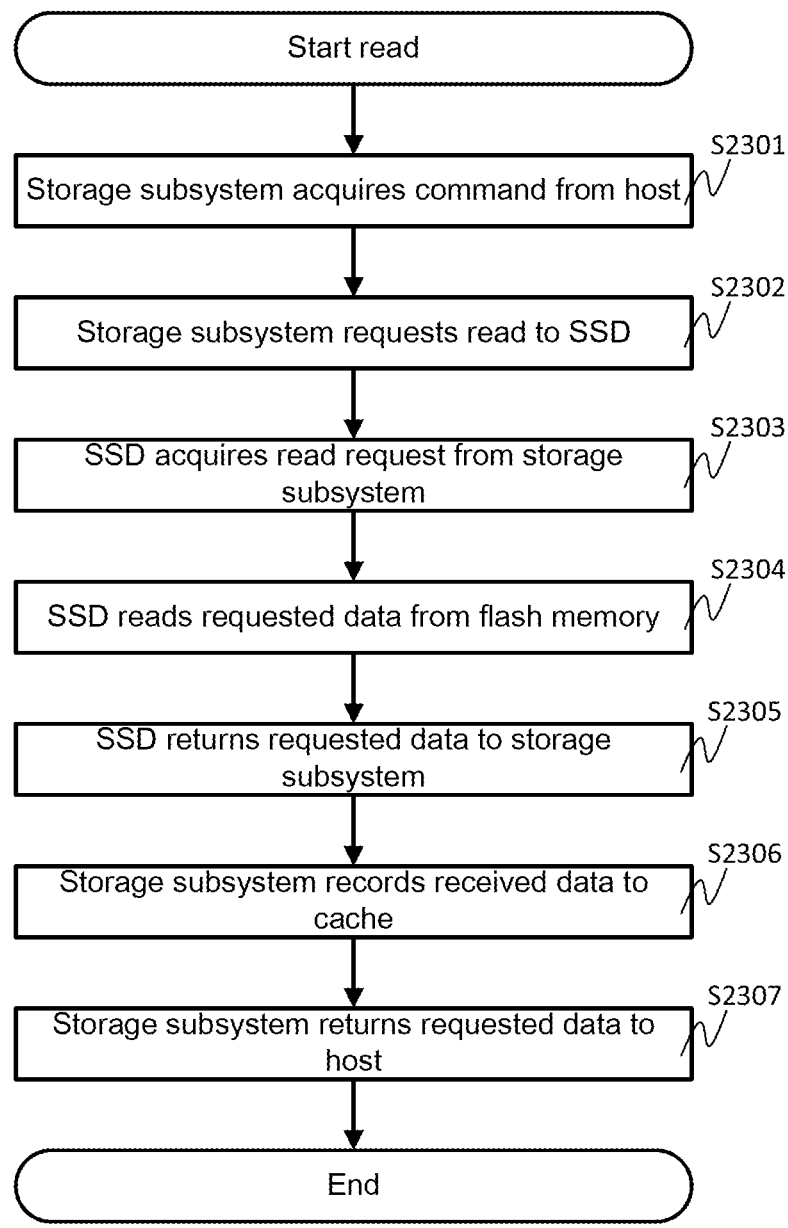
FIG. 22 is a sequence diagram illustrating one example of a process flow from a state in which a read request is issued from the host 1302 to a state in which the processing of the read request is completed.

FIG. 22 is a sequence diagram illustrating an example of a process flow from a state in which a read request is issued by the host 1302 to a state in which the processing of the read request is completed. The subject of the process is assumed to be the storage subsystem 1304 or the SSD 0100, but it can be also the storage controller 1305 or the CPU 1310. The same applies for the following description of processes.

The storage subsystem 1304 acquires a command including a read request from the host 1302 (S2301).

The storage subsystem 1304 analyzes the command, and then issues a read request to the SSD 0100 storing the relevant data (S2302).

The SSD 0100 acquires the read request from the storage subsystem 1304 (S2303). The SSD 0100 reads the requested data from the FM (S2304). The SSD 0100 transmits the requested data read in S2304 and a read complete response to the storage subsystem 1304 (S2305).

The storage subsystem 1304 receives data from the SSD 0100 as a response to the read request issued in S2302, and stores the received data in the data cache area 1404 (S2306).

The storage subsystem 1304 transmits the requested data and the read complete response to the host 1302, and ends the read processing (S2307).

Figure 23:
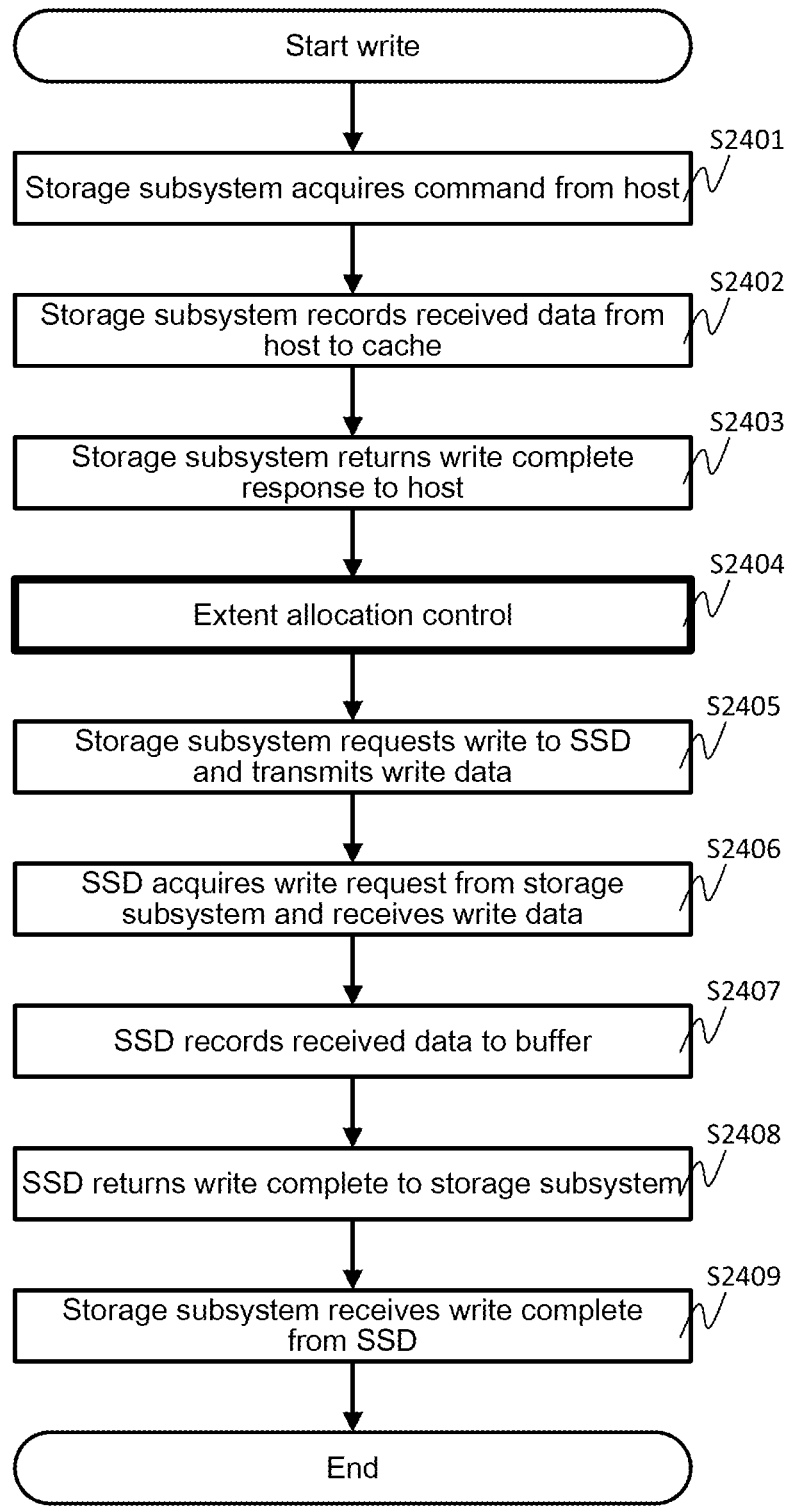
FIG. 23 is a sequence diagram illustrating one example of a process flow from a state in which a write request is issued from the host 1302 to a state in which the processing of the write request is completed.

FIG. 23 is a sequence diagram illustrating one example of the process flow from a state in which where the write request is issued from the host 1302 to a state in which the processing of the write request is completed.

The storage subsystem 1304 acquires a command including a write request from the host 1302 (S2401).

The storage subsystem 1304 analyzes the command, requests the write data to the host 1302, and stores the received write data to the data cache area 1404 (S2402).

The storage subsystem 1304 transmits a write complete response to the host 1302 (S2403).

During extent allocation control, the storage subsystem 1304 executes new allocation and reallocation of extents, and reference and update of the extent management TBL 1412 (S2404). The details of the present process will be described later.

The storage subsystem 1304 requests write to the SSD 0100 being the storage destination of the relevant data, and transmits the write data (S2405).

The SSD 0100 acquires the write request from the storage subsystem 1304, and receives the write data (S2406). The SSD 0100 stores the write data received in S2406 in the data buffer area 0304 (S2407). The SSD 0100 transmits the write complete response to the storage subsystem 1304 (S2308).

The storage subsystem 1304 receives the write complete response from the SSD 0100, and ends the write processing (S2309).

Figure 24:
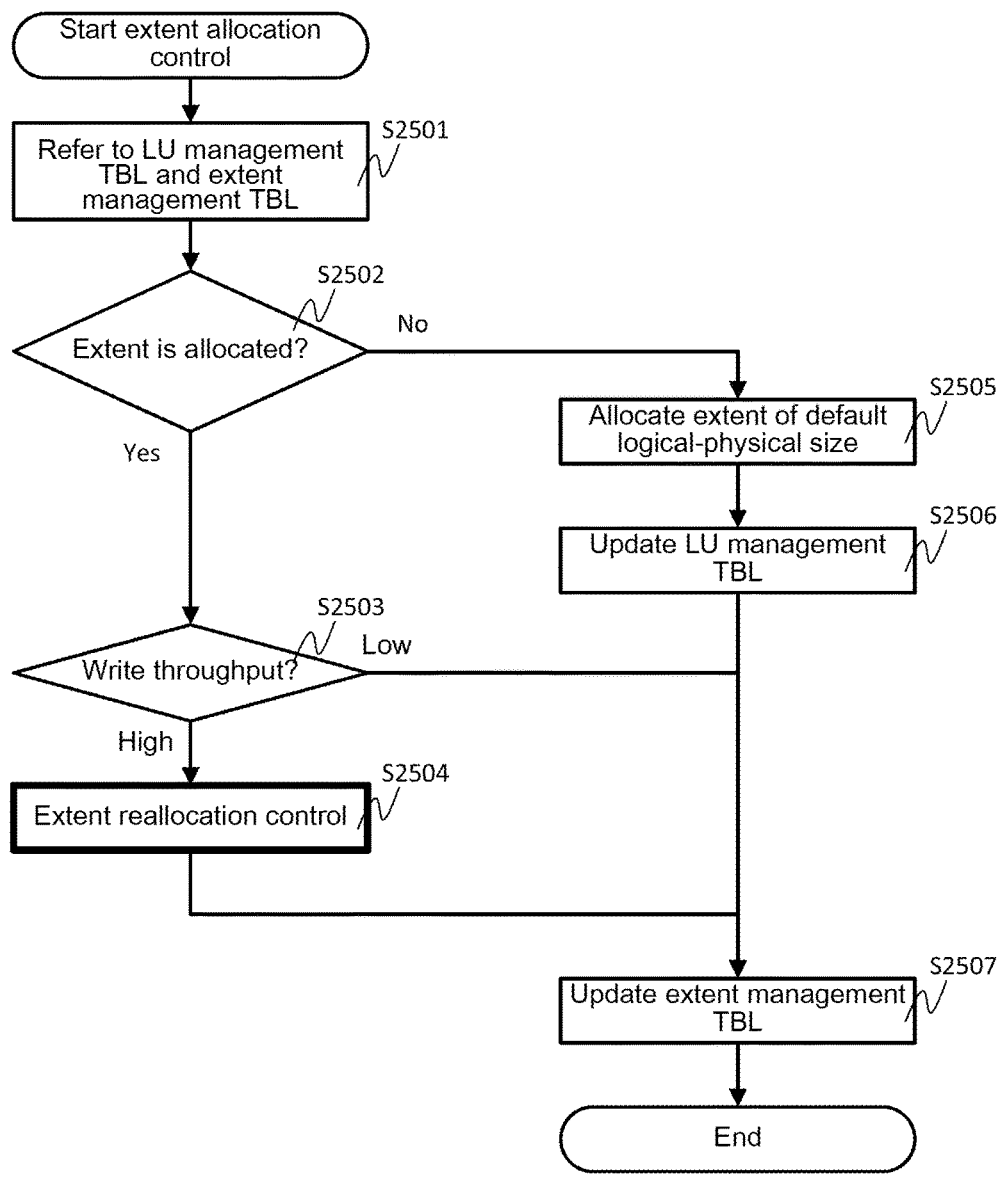
FIG. 24 is a sequence diagram illustrating one example of an extent allocation control S2404.

FIG. 24 is a sequence diagram illustrating one example of an extent allocation control S2404.

The storage subsystem 1304 refers to the LU management TBL 1413 for information related to the LU corresponding to the write data, and refers to the extent management TBL 1412 for information related to the extents corresponding to the relevant LU (S2501).

The storage subsystem 1304 determines whether extents are allocated to the relevant LU area or not based on the assigned extent 1906 referred to in S2501 (S2502). If it is determined that extents are unallocated (S2502: No), an extent of a default logical-physical size is allocated (S2505), and the assigned extent 1906 of the LU management TBL 1413 is updated (S2506). Thereafter, the allocation status 1805, the write throughput 1808, the average write size 1809 and the rate of write smaller than logical-physical size 1810 of the extent management TBL 1412 are updated (S2507), and the process is ended.

On the other hand, if it is determined in S2502 that an extent is allocated to the relevant LU area (S2502: Yes), the storage subsystem 1304 executes S2503.

The storage subsystem 1304 determines whether the write throughput of the extent of the relevant LU is high or low based on the write throughput 1808 referred to in S2501 (S2503). Whether the write throughput is high or low can be determined by setting a threshold value in advance, or based on a relative value with other extents. If it is determined that the write throughput is low (S2503: Low), the write throughput 1808, the average write size 1809 and the rate of write smaller than logical-physical size 1810 of the extent management TBL 1412 are updated (S2507), and the process is ended.

On the other hand, if it is determined in S2503 that the write throughput in the extent of the relevant LU is high (S2503: High), the storage subsystem 1304 executes S2504. The storage subsystem 1304 executes an extent reallocation control (S2504), and ends the process. The details of the present control will be described later.

In the present example, the extent allocation control S2404 is executed only in the write sequence, but it can also be executed in the read sequence of FIG. 22. In that case, the extent allocation control S2404 is performed after the process of S2301. Further, the extent allocation control S2404 executes the extent reallocation control S2504 only in a case where the write throughput is high, but it can also be executed when the read throughput is high. In that case, the extent management TBL 1412 stores the read throughput and the average read size as management information, and updates the present management information in S2507.

Figure 25:
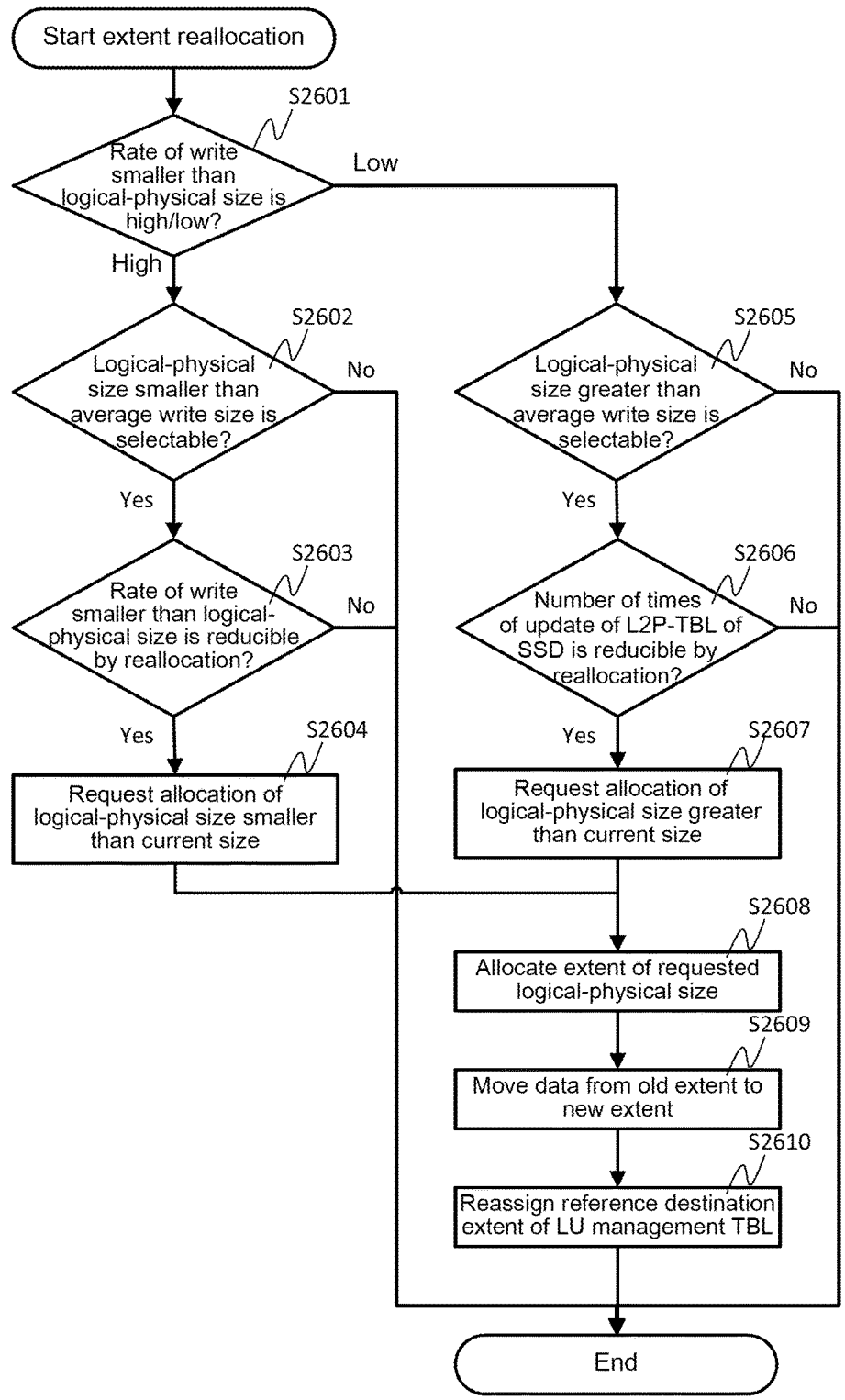
FIG. 25 is a sequence diagram illustrating one example of an extent reallocation control S2504.

FIG. 25 is a sequence diagram illustrating one example of the extent reallocation control S2504.

The storage subsystem 1304 determines whether the rate of write smaller than logical-physical size in the extent of the relevant LU is high or low based on the rate of write smaller than logical-physical size 1810 referred to in S2501 (S2601). Whether the rate of write smaller than logical-physical size is high or low can be determined by setting a threshold value in advance, or based on a relative value with other extents. If it is determined that the rate of write smaller than logical-physical size is low (S2601: Low), the storage subsystem 1304 executes S2605 (A). On the other hand, if the rate of write smaller than logical-physical size is high (S2601: High), the storage subsystem 1304 executes S2602 (B).

In the case of (B) (S2601: High), the storage subsystem 1304 determines whether a logical-physical size smaller than the average write size is selectable in the extent of the relevant LU based on the average write size 1809 and the logical-physical size 1807 referred to in S2501 (S2602). As a result of the determination, if a logical-physical size smaller than the average write size is not selectable (S2602: No), the storage subsystem 1304 ends the process.

On the other hand, if it is determined that a logical-physical size smaller than the average write size is selectable in the extent of the relevant LU (S2602: Yes), the storage subsystem 1304 executes S2603.

The storage subsystem 1304 determines whether the rate of write smaller than logical-physical size is reducible by reallocating the extent based on the logical-physical size 1807, the average write size 1809 and the rate of write smaller than logical-physical size 1810 referred to in S2501 (S2603). For example, in a case where the logical-physical size is 16 kB, the average write size is 10 kB and the rate of write smaller than logical-physical size is 80% in the relevant extent, the rate of write smaller than logical-physical size is reducible by allocating an extent having a logical-physical size of 8 kB. Whether the rate of write smaller than logical-physical size is reducible can be determined by setting a threshold value in advance, and determining that cases exceeding the threshold value is reducible. If it is determined that the rate of write smaller than logical-physical size is not reducible (S2603: No), the storage subsystem 1304 ends the process.

On the other hand, if it is determined that the rate of write smaller than logical-physical size is reducible by reallocating the extent (S2603: Yes), the storage subsystem 1304 requests allocation of a logical-physical size smaller than the current size (S2604), and executes S2608 (C).

According to (A) (S2601: Low), the storage subsystem 1304 determines whether a logical-physical size greater than the average write size is selectable in the extent of the relevant LU based on the average write size 1809 and the logical-physical size 1807 referred to in S2601 (S2605). If it is determined that a logical-physical size smaller than the average write size is non-selectable (S2605: No), the storage subsystem 1304 ends the process.

On the other hand, if it is determined that the logical-physical size greater than the average write size is selectable in the extent of the relevant LU (S2605: Yes), the storage subsystem 1304 executes S2606.

The storage subsystem 1304 determines whether the number of times of update of the L2P-TBL of the SSD 0100 is reducible by reallocating an extent based on the logical-physical size 1807, the average write size 1809 and the rate of write smaller than logical-physical size 1810 referred to in S2601 (S2606). For example, in a case where the logical-physical size is 8 kB, the average write size is 32 kB and the rate of write smaller than logical-physical size is 1% in the relevant extent, the number of times of update of the L2P-TBL of the SSD 0100 is reducible by allocating an extent with a logical-physical size of 16 kB. Whether the number of times of updates of the L2P-TBL is reducible is determined by setting a threshold value in advance, and determining that those exceeding the threshold value can be reduced. If it is determined that the number of times of update of the L2P-TBL is not reducible (S2606: No), the storage subsystem 1304 ends the process.

On the other hand, if it is determined that the number of times of update of the L2P-TBL of the SSD 0100 is reducible by reallocation of the extent (S2603: Yes), the storage subsystem 1304 requests allocation of a logical-physical size greater than the current size (S2604), and executes S2608 (C).

According to (C) (S2604 or S2407), the storage subsystem 1304 receives a reallocation request of extent from S2604 or S2607, and allocates an extent having the requested logical-physical size (S2608). The storage subsystem 1304 moves (copies) the data in the extent (old extent) of the relevant LU to the extent (new extent) allocated in S2608 (S2609).

The storage subsystem 1304 reassigns the old extent of the relevant LU to the new extent of S2609 (changes the allocation destination), and frees the old extent (S2610). Specifically, it updates the assigned extent #1906 of the LU management TBL 1413 to that of the new extent, and updates the allocation status 1805 of the relevant entry in the extent management TBL 1412 regarding the old extent to "not allocated", and ends the process.

The present example illustrates a sequence of a case where the process is executed in a state where write throughput is determined to be high in S2503. On the other hand, as described in the description of FIG. 24, the extent reallocation control S2504 can also be executed in a case where the read throughput is determined to be high. In the extent reallocation control S2504 executed in a case where the read throughput is determined to be high, a logical-physical size greater than the average read size is selectable, and in a case where the number of times of reference of the L2P-TBL 0312 of the SSD 0100 is determined to be reducible by reallocation, reallocation of an extent having a greater logical-physical size than the current size is executed.

As described, according to the second embodiment of the present invention, similar to the first embodiment, an appropriate logical-physical size corresponding to I/O patterns and I/O sizes is utilized, and the amount of logical-physical management information is reduced, such that the ratio of logical-physical management information being stored in the main memory is increased. Thus, it becomes possible to either reduce the frequency of logical-physical miss or eliminate the same, and suppress the deterioration of system performance of the hierarchical logical-physical system. Furthermore, the number of times of reference and update of the logical-physical management information in the logical-physical transformation process can be reduced by selecting an appropriate logical-physical size, and the system performance can be improved.

The present invention is not restricted to the above-illustrated preferred embodiments, and can include various modifications. The above-illustrated embodiments are described in detail to help understand the present invention, and the present invention is not restricted to a structure including all the components illustrated above. Further, a portion of the configuration of an embodiment can be replaced with the configuration of another embodiment, or the configuration of a certain embodiment can be added to the configuration of another embodiment. Moreover, a portion or all of the configurations of each embodiment can be added to, deleted from or replaced with other configurations. The configurations and functions described above can be realized through software by having a processor interpret and execute programs for realizing the respective functions. The respective configurations, functions and the like described above can be realized by software by the processor interpreting and executing programs for realizing the respective functions.

The information such as the programs, tables and files for realizing the respective functions can be stored in storage devices such as memories, hard disks or SSDs (Solid State Drives), or in memory media such as IC cards, SD cards or DVDs. Only the control lines and information lines considered necessary for description are illustrated in the drawings, and not necessarily all the control lines and information lines required for production are illustrated. In actual application, it can be considered that almost all the components are mutually coupled.

REFERENCE SIGNS LIST

0100: SSD, 0101: superior device, 0103: logical-physical distribution unit, 0203: SSD controller, 0105: 8-kB logical address space, 0106: 16-kB logical address space, 0107: 8-kB logical transformation control, 0108: 16-kB logical transformation control, storage subsystem, 0309: logical-physical transformation program, 0308: logical-physical size distribution control program, 0311: V2L-TBL, 0312: L2P-TBL, 0313: SSD information TBL

The invention claimed is:
1. A semiconductor memory device connected to a superior device and configured to provide a virtual storage area, the semiconductor memory device comprising:
   a storage unit configured of one or more nonvolatile memory drives;
   a storage unit comprising one or more storage drives configured to store data from the superior device;

a first storage area comprising a first storage capacity in which the logical address is transformed into the physical address according to the first unit of logical-physical transformation;

a second storage area comprising a second storage capacity in which the logical address is transformed into the physical address according to the second unit of logical-physical transformation; and a control unit configured to control the storage unit, wherein the control unit comprises:

a communication unit configured to receive an input/output request specifying a logical address of a logical storage area based on the storage unit from the superior device, a memory configured to store an address transformation information representing a correspondence between the logical address and a physical address of the storage unit, and a processor configured to transform the logical address to the physical address, wherein the processor selects a first unit of logical-physical transformation or a second unit of logical-physical transformation being greater than the first unit of logical-physical transformation, and transforms the logical address to the physical address, based on the input/output request from the superior device, wherein the superior device is configured to select the first storage area or the second storage area and perform the input/output request to the semiconductor memory device, wherein the address transformation information includes an average size of data write per one input request from the superior device, and a rate of write smaller than the unit of logical-physical transformation, which is a rate of occurrence of write of a unit smaller than the first unit of logical-physical transformation or the second unit of logical-physical transformation, and the processor updates the address transformation information for each input/output request from the superior device, and changes the unit of logical-physical transformation from the logical address to the physical address based on the average size of data write and the rate of write smaller than the unit of logical-physical transformation.

2. The semiconductor memory device according to claim 1, wherein the storage unit comprises one or more RAID groups configured of one or more nonvolatile memory drives, the RAID groups respectively include one or more first storage areas and second storage areas, and the processor configures a virtual storage area to be provided to the superior device using one or more storage areas having a same transformation unit within the RAID group.

3. The semiconductor memory device according to claim 1, wherein in a state where the rate of write smaller than the unit of logical-physical transformation is higher than a threshold value stored in the semiconductor memory device in advance and the average size of data write is smaller than the second unit of logical-physical transformation, the input/output request from the superior device is processed by the first unit of logical-physical transformation in order to reduce the rate of write smaller than the unit of logical-physical transformation.

4. The semiconductor memory device according to claim 1, wherein in a state where the rate of write smaller than the unit of logical-physical transformation is lower than a threshold value stored in the semiconductor memory device in advance and the average size of data write is greater than the first unit of logical-physical transformation, the input/output request from the superior device is processed by the second unit of logical-physical transformation in order to reduce a number of times of update of the address transformation information.

5. A storage subsystem comprising a semiconductor memory device connected to a superior device and configured to provide a virtual storage area, the semiconductor memory device comprising:

a storage unit configured of one or more nonvolatile memory drives;

a storage unit comprising one or more storage drives configured to store data from the superior device;

a first storage area comprising a first storage capacity in which the logical address is transformed into the physical address according to the first unit of logical-physical transformation;

a second storage area comprising a second storage capacity in which the logical address is transformed into the physical address according to the second unit of logical-physical transformation; and a control unit configured to control the storage unit, wherein the control unit comprises:

a communication unit configured to receive an input/output request specifying a logical address of a logical storage area based on the storage unit from the superior device, a memory configured to store an address transformation information representing a correspondence between the logical address and a physical address of the storage unit, and a processor configured to transform the logical address to the physical address, wherein the processor selects a first unit of logical-physical transformation or a second unit of logical-physical transformation greater than the first unit of logical-physical transformation, and transforms the logical address to the physical address, based on the input/output request from the superior device, wherein the superior device is configured to select the first storage area or the second storage area and perform the input/output request to the semiconductor memory device, wherein the address transformation information includes an average size of data write per one input request from the superior device, and a rate of write smaller than the unit of logical-physical transformation, which is a rate of occurrence of write of a unit smaller than the first unit of logical-physical transformation or the second unit of logical-physical transformation, and the processor updates the address transformation information for each input/output request from the superior device, and changes the unit of logical-physical transformation from the logical address to the physical address based on the average size of data write and the rate of write smaller than the unit of logical-physical transformation.

6. The storage subsystem according to claim 5, wherein the storage unit comprises one or more RAID groups configured of one or more nonvolatile memory drives, the RAID groups respectively include one or more first storage areas and second storage areas, and the processor configures a virtual storage area to be provided to the superior device using one or more storage areas having a same transformation unit within the RAID group.

7. The storage subsystem according to claim 5, wherein in a state where the rate of write smaller than the unit of logical-physical transformation is higher than a threshold value stored in the semiconductor memory device in advance and the average size of data write is smaller than the second unit of logical-physical transformation, the input/output request from the superior device is processed by the first unit of logical-physical transformation in order to reduce the rate of write smaller than the unit of logical-physical transformation.

8. The storage subsystem according to claim 5, wherein in a state where the rate of write smaller than the unit of logical-physical transformation is lower than a threshold value stored in the semiconductor memory device in advance and the average size of data write is greater than the first unit of logical-physical transformation, the input/output request from the superior device is processed by the second unit of logical-physical transformation in order to reduce a number of times of update of the address transformation information.

9. A method for controlling a semiconductor memory device connected to a superior device and configured to provide a virtual storage area, the semiconductor memory device comprising:

a storage unit configured of one or more nonvolatile memory drives;

a storage unit comprising one or more storage drives configured to store data from the superior device;

a first storage area comprising a first storage capacity in which the logical address is transformed into the physical address according to the first unit of logical-physical transformation;

a second storage area comprising a second storage capacity in which the logical address is transformed into the physical address according to the second unit of logical-physical transformation; and a control unit configured to control the storage unit, wherein the control unit comprises:

a communication unit configured to receive an input/output request specifying a logical address of a logical storage area based on the storage unit from the superior device, a memory configured to store an address transformation information representing a correspondence between the logical address and a physical address of the storage unit, and a processor configured to transform the logical address to the physical address, wherein the processor selects a first unit of logical-physical transformation or a second unit of logical-physical transformation greater than the first unit of logical-physical transformation, and transforms the logical address to the physical address, based on the input/output request from the superior device, wherein the superior device is configured to select the first storage area or the second storage area and perform the input/output request to the semiconductor memory device, wherein the address transformation information includes an average size of data write per one input request from the superior device, and a rate of write smaller than the unit of logical-physical transformation, which is a rate of occurrence of write of a unit smaller than the first unit of logical-physical transformation or the second unit of logical-physical transformation, and the processor updates the address transformation information for each input/output request from the superior device, and changes the unit of logical-physical transformation from the logical address to the physical address based on the average size of data write and the rate of write smaller than the unit of logical-physical transformation.

10. The method for controlling a semiconductor memory device according to claim 9, wherein the storage unit comprises one or more RAID groups configured of one or more nonvolatile memory drives, the RAID groups respectively include one or more first storage areas and second storage areas, and the processor configures a virtual storage area to be provided to the superior device using one or more storage areas having a same transformation unit within the RAID group.

\* \* \* \* \*